(12) United States Patent
Hosaka

(10) Patent No.: US 7,880,218 B2
(45) Date of Patent: Feb. 1, 2011

(54) SEMICONDUCTOR DEVICE AND FABRICATION METHOD THEREFOR

(75) Inventor: Masaya Hosaka, Fukushima-ken (JP)

(73) Assignee: Spansion LLC, Sunnyvale, CA (US)

( * ) Notice: Subject to any disclaimer, the term of this patent is extended or adjusted under 35 U.S.C. 154(b) by 894 days.

(21) Appl. No.: 11/478,537

(22) Filed: Jun. 28, 2006

(65) Prior Publication Data

US 2006/0291262 A1    Dec. 28, 2006

Related U.S. Application Data

(63) Continuation-in-part of application No. PCT/JP2005/011814, filed on Jun. 28, 2005.

(51) Int. Cl.
*H01L 29/792* (2006.01)

(52) U.S. Cl. ............................ 257/324; 257/E29.309; 365/51

(58) Field of Classification Search ................. 257/316, 257/324, E27.103, E29.301, E29.309; 365/51
See application file for complete search history.

(56) References Cited

U.S. PATENT DOCUMENTS 7,125,763 B1 * 10/2006 Sobek et al. ................ 438/201

FOREIGN PATENT DOCUMENTS

| JP | 63170969 | 7/1988 |
|---|---|---|
| JP | 1074761 | 3/1989 |
| JP | 3125460 | 5/1991 |
| JP | 2000286349 | 10/2000 |

* cited by examiner

*Primary Examiner*—Mary Wilczewski
*Assistant Examiner*—Toniae M Thomas

(57) ABSTRACT

There is provided a semiconductor device including bit lines (14) formed in a semiconductor substrate (10), insulating film lines (18) located on the bit lines (14) to successively run in a length direction of the bit lines (14), gate electrodes (16) located above the semiconductor substrate (10) between the bit lines (14), and word lines (20) located on the gate electrodes (16) to run in a width direction of the bit lines (14), a trench region (22) formed between the bit lines (14) and the between word lines (20) in the semiconductor substrate, and there is also provided a fabrication method therefor. According to the present invention, it is possible to provide a semiconductor device where elements can be isolated between the word lines (14) and memory cells can be miniaturized, and to provide a fabrication method therefor.

18 Claims, 22 Drawing Sheets

SEMICONDUCTOR DEVICE AND FABRICATION METHOD THEREFOR

CROSS-REFERENCES TO RELATED APPLICATIONS

This is a continuation in part of International Application No. PCT/JP2005/011814, filed Jun. 28, 2005 which was not published in English under PCT Article 21(2).

BACKGROUND OF THE INVENTION

1. Technical Field

This invention relates generally to semiconductor devices and fabrication methods therefor, and more particularly, to a semiconductor device having a trench portion in a semiconductor substrate between bit lines and between word lines and a fabrication method therefor.

2. Description of the Related Art

In recent years, non-volatile memory semiconductor devices, in which data is rewritable, have been widely used. In the technical field of such non-volatile memories, developments of downsizing the memory cells are being promoted to obtain higher storage capacity. As non-volatile memories, there has been developed flash memories having Oxide/Nitride/Oxide (ONO) film such as Metal Oxide Nitride Oxide Silicon (MONOS) or Silicon Oxide Nitride Oxide Silicon (SONOS). Among them, for purposes of miniaturizing memory cells, there have been developed flash memories in which the bit lines are embedded in the semiconductor substrate to serve as source/drain regions.

The above-described conventional technique (referred to as conventional technique 1) is described, by reference to FIG. 1 (PRIOR ART) and FIG. 2 (PRIOR ART). FIG. 1 (PRIOR ART) is a top view of a flash memory in accordance with the conventional technique 1. FIG. 2A (PRIOR ART) and FIG. 2B (PRIOR ART) are cross-sectional views thereof. FIG. 2A (PRIOR ART) is a cross-sectional view taken along a line A-A shown in FIG. 1 (PRIOR ART). FIG. 2B (PRIOR ART) is a cross-sectional view taken along a line B-B shown in FIG. 1 (PRIOR ART). Referring to FIG. 1 (PRIOR ART), bit lines 14 run in a vertical direction in FIG. 1 (PRIOR ART), and word lines 15 run in a width direction of the bit lines.

Referring now to FIG. 2A (PRIOR ART) and FIG. 2B (PRIOR ART), the bit lines 14 that serve as source/drain regions are embedded in a semiconductor substrate 10. An ONO film 12 is formed on or above the semiconductor substrate 10. The word lines 15 that serve as gate electrodes are provided on the ONO film 12.

The semiconductor substrate 10, being provided below the word lines (gate electrodes) 15 arranged between the bit lines (between the source/drain regions) 14, serves as a channel. By storing charge in the ONO film 12 on the channel, the flash memory functions as a non-volatile memory.

Japanese Patent Application Publication No. 2004-111874 (hereinafter, referred to as Patent Document 1) and Japanese Patent Application Publication No. 05-198778 (hereinafter, referred to as Patent Document 2) respectively disclose techniques of forming a thermally-oxidized silicon film on the bit lines in a semiconductor device having trench portions between the bit lines 14 and between the word lines 15 in the semiconductor substrate 10. At the time of forming the word lines, trench recess portions are formed in the semiconductor substrate by using the thermally-oxidized silicon film provided on the bit lines as a mask.

In Patent Document 1, there is provided one layer of the word lines in the gate electrode structure above the channel (referred to as conventional technique 2). Meanwhile, in Patent Document 2, there are provided a floating gate, a silicon oxide film, and a control gate (word line) in the gate electrode structure above the channel (referred to as conventional technique 3).

FIG. 3A (PRIOR ART) and FIG. 3B (PRIOR ART) are views explaining the problem in the conventional technique 1. FIG. 3A (PRIOR ART) is a top view of a flash memory of the conventional technique 1. FIG. 3B (PRIOR ART) is a cross-sectional view taken along a line B-B shown in FIG. 3A (PRIOR ART). Referring to FIG. 3A (PRIOR ART), according to the conventional technique 1, the charge is written into the ONO film 12 by applying a high voltage between the bit lines 14 and then trapping in a trap layer, the charge whose energy becomes high in a channel 50 below the word line (gate electrode) 15.

Current in the semiconductor substrate 10 below the word line 15, however, also flows at both sides of the channel 50 below the word line 15, as indicated by dashed arrows shown in FIG. 3A (PRIOR ART). As shown in FIG. 3B (PRIOR ART), the channel expands to the both sides of the channel 50 below the word line 15 (as represented by reference numeral 52). Accordingly, the charge is trapped not only in the ONO film 12 below the word line 15 (as represented by reference numeral 54) but also in the both sides of the word line 15 (as represented by reference numeral 54a).

As stated, when the charge is trapped in the ONO film 12 at both sides of the word line 15, the following problems occur. Firstly, the charge cannot be erased at the time of erase operation. Next, the charge is trapped in the ONO film 12 below adjacent word lines 15. These problems will cause another problem in that the memory cells malfunction. For this reason, it is difficult to narrow the distances between the word lines 15 and downsize the memory cells.

Therefore, it can be considered that the trench portion is provided in the semiconductor substrate 10 between the bit lines 14 and between the word lines 15. However, in the structure (LOCOS structure) having a thermally-oxidized silicon film on the bit lines, the bird' beaks are produced and downsizing is difficult. Also, in the conventional technique 3, there is provided an oxide film layer between the control gate and the floating gate, thereby complicating the etch process to form the floating gate, control gate, and trench portion. This is because the oxide film provided on the bit lines is used as an etching mask during the etch process of forming the trench portion.

SUMMARY OF THE INVENTION

It is an object of the present invention to provide a semiconductor device and fabrication method therefor, in which elements are isolated between the word lines and the memory cells can be miniaturized.

According to a first aspect of the present invention, there is preferably provided a semiconductor device including: bit lines formed in a semiconductor substrate; insulating film lines located on the bit lines to successively run in a length direction of the bit lines; gate electrodes located above the semiconductor substrate between the bit lines; and word lines located on the gate electrodes to run in a width direction of the bit lines; a trench region formed between the bit lines and the between word lines in the semiconductor substrate. According to the present invention, the trench region prevents current from flowing on both sides of the word lines in the semiconductor substrate. This also prevents the charge from being trapped in the ONO film located on both sides of the word lines. Accordingly, it is possible to narrow a spacing width between the word lines, thereby providing a semiconductor device where the memory cells can be miniaturized.

According to a second aspect of the present invention, there is preferably provided a method of fabricating a semiconductor device including: forming bit lines in a semiconductor substrate; forming insulating film lines on the bit lines to successively run in a length direction of the bit lines; forming gate electrodes above the semiconductor substrate between the bit lines; forming word lines on the gate electrodes to run in a width direction of the bit lines; and forming a trench region between the bit lines and between the word lines in the semiconductor substrate. Forming the trench region may include etching the semiconductor substrate by using at least the insulating film lines as an etching mask. According to the present invention, the trench region prevents current from flowing on both sides of the word lines in the semiconductor substrate. This also prevents the charge from being trapped in the ONO film located on both sides of the word lines. Accordingly, it is possible to narrow a spacing width between the word lines, thereby providing a fabrication method of a semiconductor device where the memory cells can be miniaturized.

BRIEF DESCRIPTION OF THE DRAWINGS

FIG. 5A is a cross-sectional view taken along a line A-A shown in FIG. 4, FIG. 5B is a cross-sectional view taken along a line B-B shown in FIG. 4, and FIG. 5C is a cross-sectional view taken along a line C-C shown in FIG. 4;

FIG. 6A is a cross-sectional view taken along a line D-D shown in FIG. 4, and FIG. 6B is a cross-sectional view taken along a line E-E shown in FIG. 4;

FIG. 7A is a cross-sectional view taken along a line A-A shown in FIG. 4, FIG. 7B is a cross-sectional view taken along a line B-B shown in FIG. 4, and FIG. 7C is a cross-sectional view taken along a line D-D shown in FIG. 4;

FIG. 8A is a cross-sectional view taken along a line A-A shown in FIG. 4, FIG. 8B is a cross-sectional view taken along a line B-B shown in FIG. 4, and FIG. 8C is a cross-sectional view taken along a line D-D shown in FIG. 4;

FIG. 9A is a cross-sectional view taken along a line A-A shown in FIG. 4, FIG. 9B is a cross-sectional view taken along a line B-B shown in FIG. 4, and FIG. 9C is a cross-sectional view taken along a line D-D shown in FIG. 4;

FIG. 10A is a cross-sectional view taken along a line A-A shown in FIG. 4, FIG. 10B is a cross-sectional view taken along a line B-B shown in FIG. 4, and FIG. 10C is a cross-sectional view taken along a line D-D shown in FIG. 4;

FIG. 11A is a cross-sectional view taken along a line A-A shown in FIG. 4, FIG. 11B is a cross-sectional view taken along a line B-B shown in FIG. 4, and FIG. 11C is a cross-sectional view taken along a line D-D shown in FIG. 4;

FIG. 12A is a cross-sectional view taken along a line A-A shown in FIG. 4, FIG. 12B is a cross-sectional view taken along a line B-B shown in FIG. 4, and FIG. 12C is a cross-sectional view taken along a line C-C shown in FIG. 4;

FIG. 13A is a cross-sectional view taken along a line A-A shown in FIG. 4, and FIG. 13B is a cross-sectional view taken along a line D-D shown in FIG. 4;

FIG. 14A is a cross-sectional view taken along a line A-A shown in FIG. 4, and FIG. 14B is a cross-sectional view taken along a line D-D shown in FIG. 4;

FIG. 15A is a cross-sectional view taken along a line A-A shown in FIG. 4, and FIG. 15B is a cross-sectional view taken along a line D-D shown in FIG. 4;

FIG. 16A is a cross-sectional view taken along a line A-A shown in FIG. 4, and FIG. 16B is a cross-sectional view taken along a line D-D shown in FIG. 4;

FIG. 17A is a cross-sectional view taken along a line A-A shown in FIG. 4, and FIG. 17B is a cross-sectional view taken along a line D-D shown in FIG. 4;

FIG. 18A is a cross-sectional view taken along a line A-A shown in FIG. 4, and FIG. 18B is a cross-sectional view taken along a line D-D shown in FIG. 4; FIG. 19A is a cross-sectional view taken along a line A-A shown in FIG. 4, and FIG. 19B is a cross-sectional view taken along a line D-D shown in FIG. 4.

DESCRIPTION OF THE PREFERRED EMBODIMENTS

A description will now be given, with reference to the accompanying drawings, of embodiments of the present invention.

First Embodiment

Figure 1:
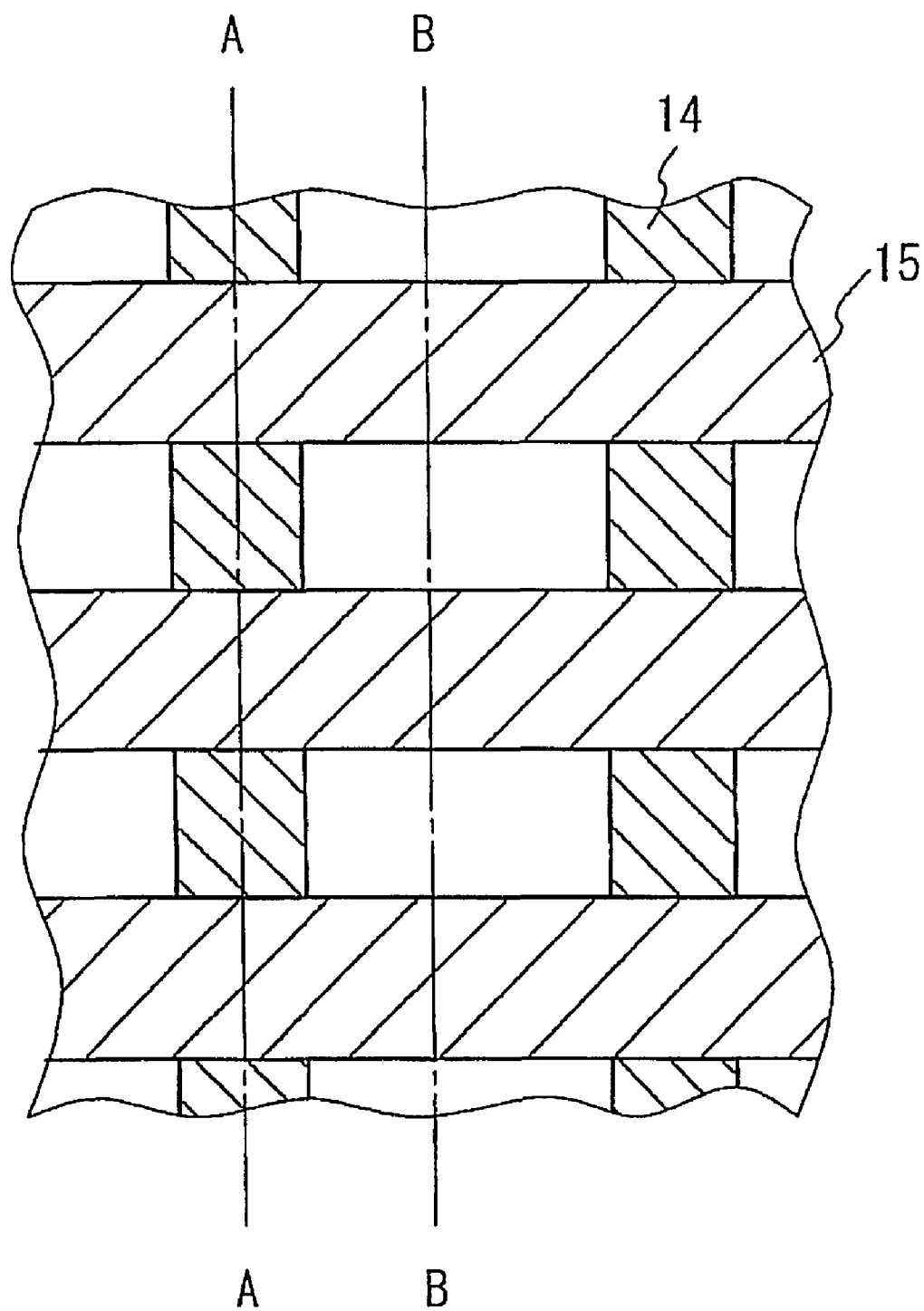
FIG. 1 (PRIOR ART) is a top view of a flash memory in accordance with the conventional technique 1.
Figure 2A:
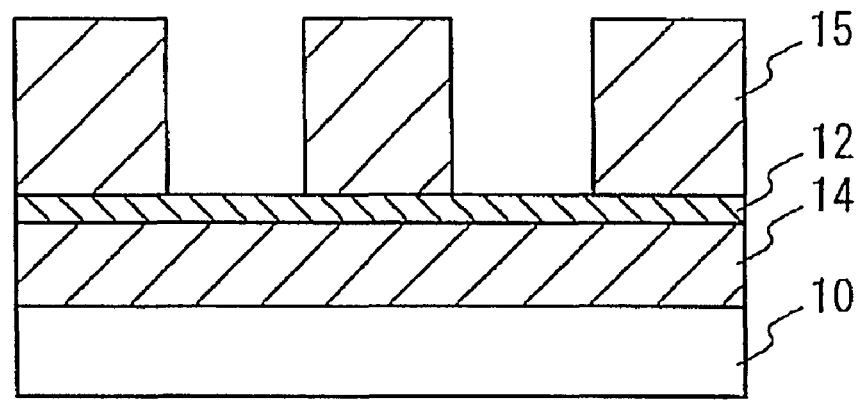
FIG. 2A (PRIOR ART) is a cross-sectional view taken along a line A-A shown in FIG. 1 (PRIOR ART), and FIG. 2B (PRIOR ART) is a cross-sectional view taken along a line B-B shown in FIG. 1 (PRIOR ART)
Figure 2B:
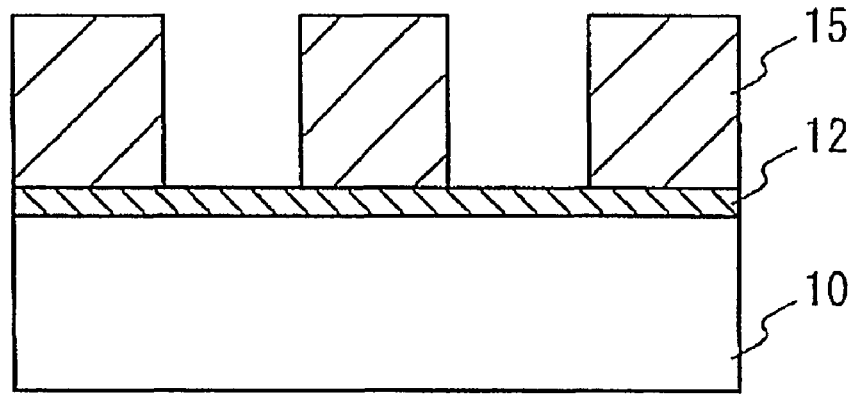
Figure 3A:
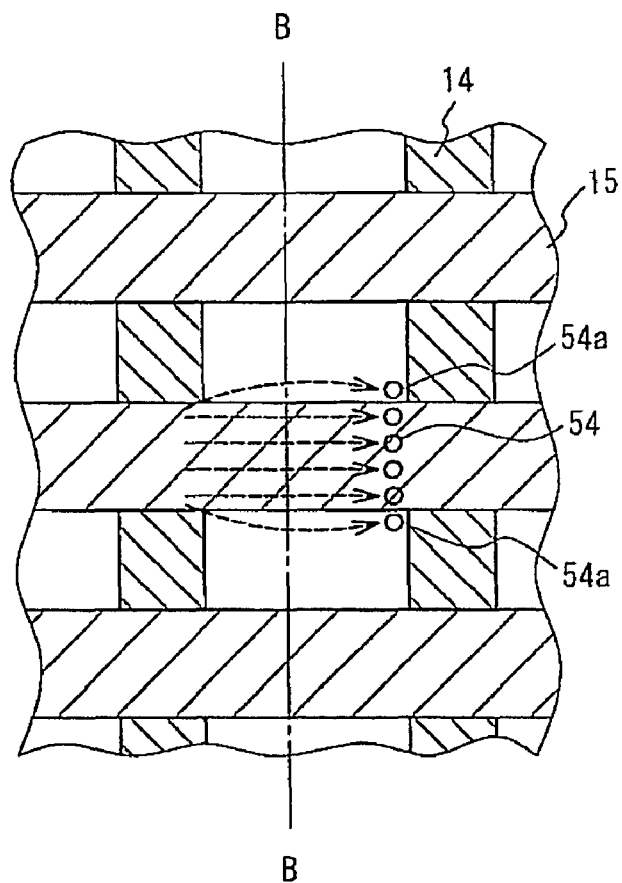
FIG. 3A (PRIOR ART) and FIG. 3B (PRIOR ART) are views explaining the problem in the conventional technique 1, FIG. 3A (PRIOR ART) is a top view of a flash memory of the conventional technique 1, and FIG. 3B (PRIOR ART) is a cross-sectional view taken along a line B-B shown in FIG. 3A (PRIOR ART)
Figure 3B:
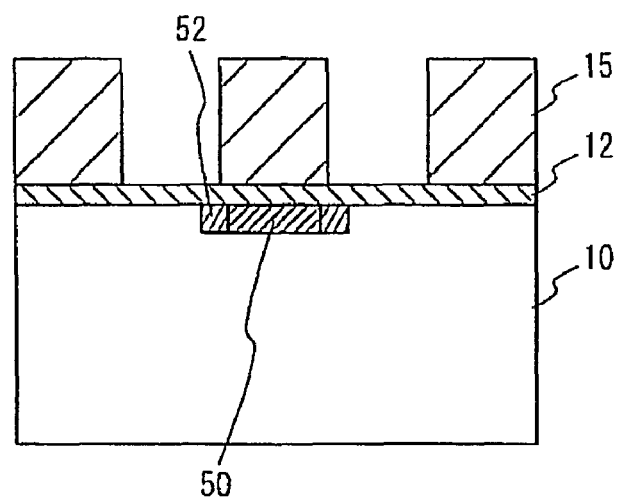
Figure 4:
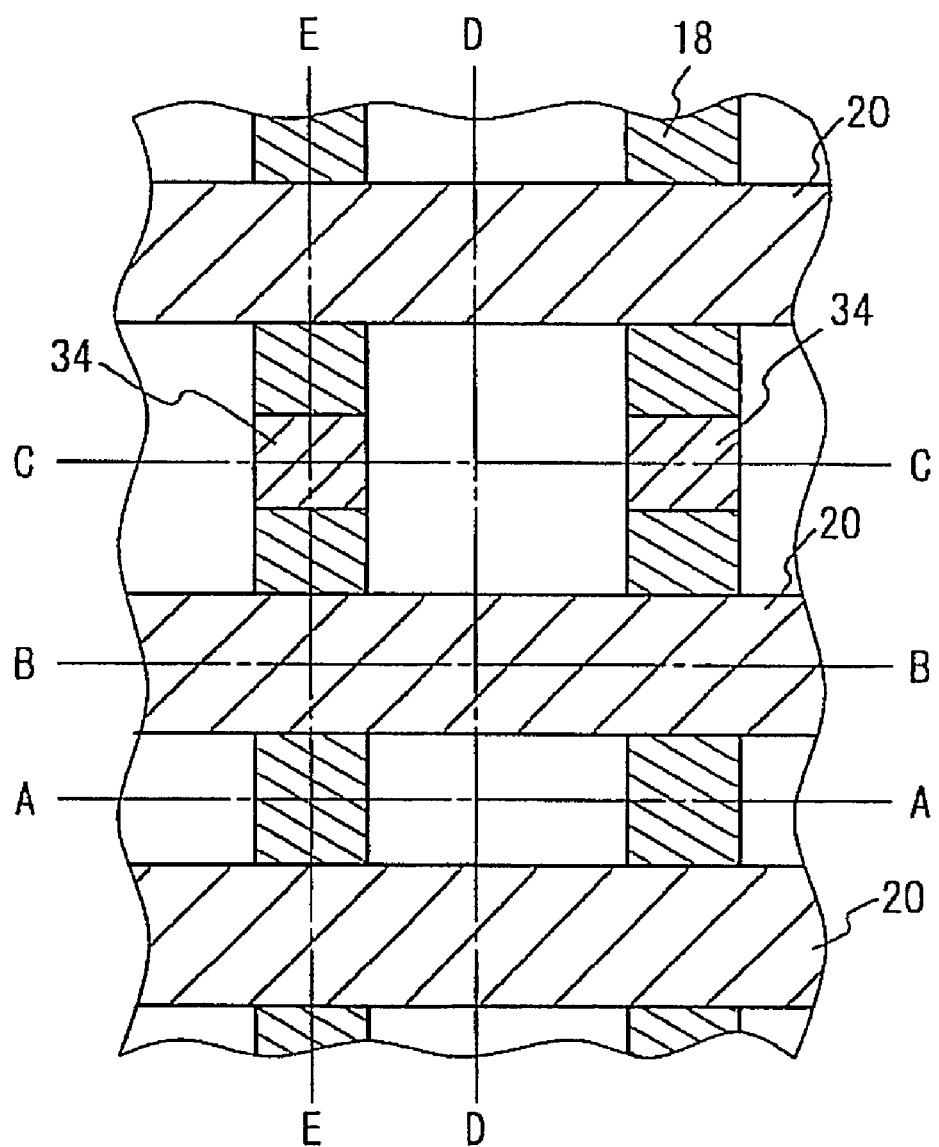
FIG. 4 is a top view of a flash memory in accordance with a first embodiment of the present invention.
Figure 5A:
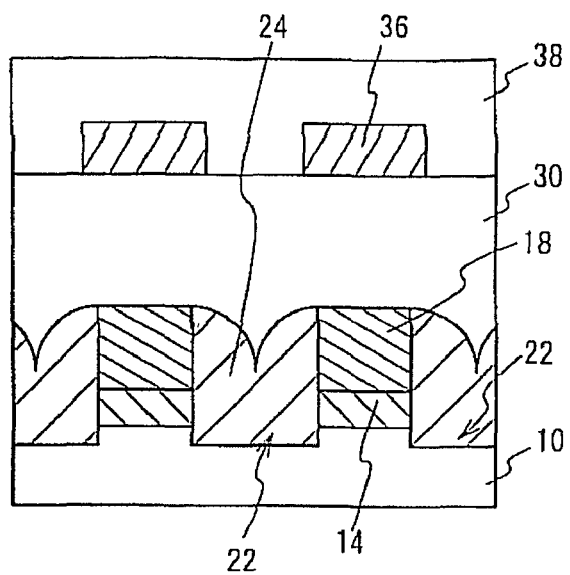
FIG. 5A through FIG. 5C are cross-sectional views of the flash memory in accordance with the first embodiment of the present invention.
Figure 5B:
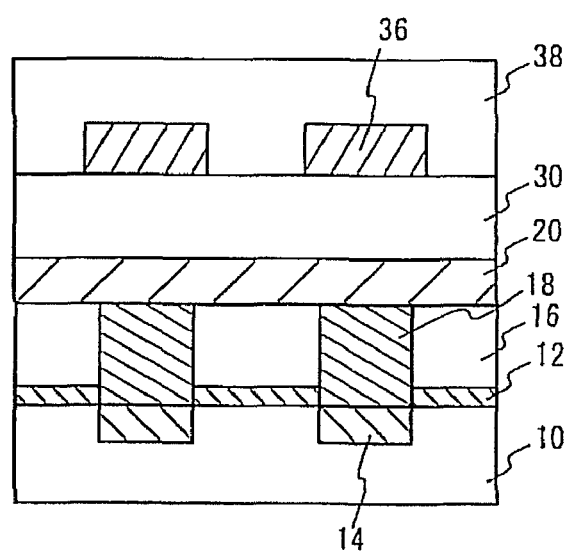
Figure 5C:
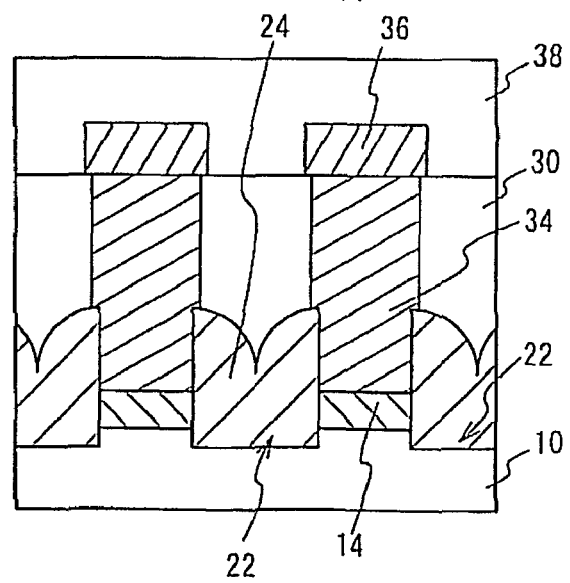
Figure 6A:
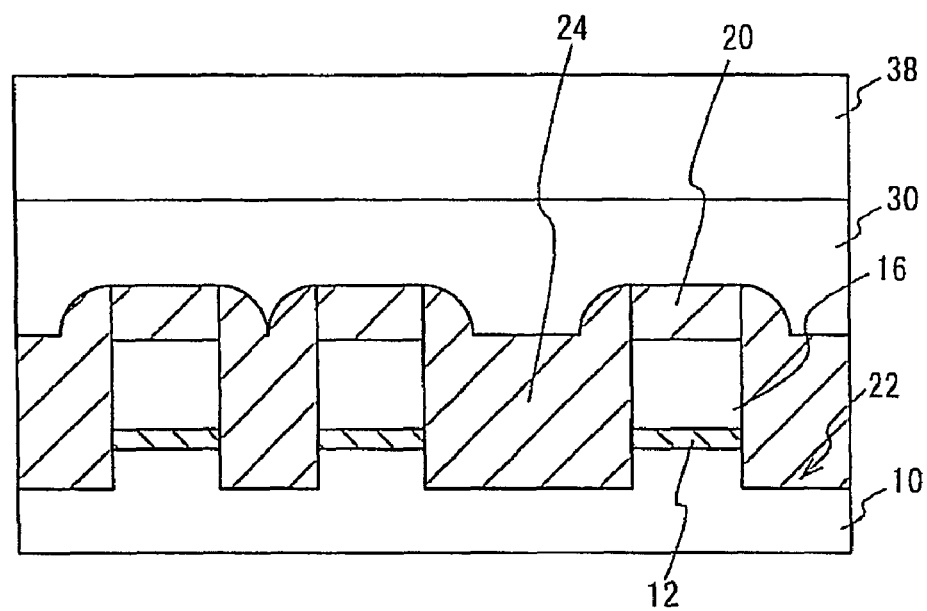
FIG. 6A and FIG. 6B are cross-sectional views of the flash memory in accordance with the first embodiment of the present invention.
Figure 6B:
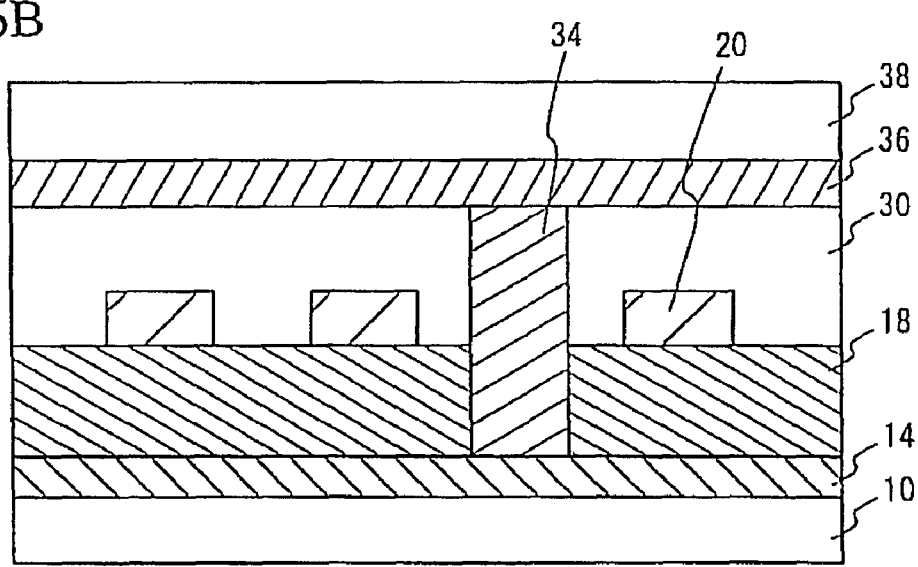

FIG. 4 is a top view of a flash memory in accordance with a first embodiment of the present invention (a protection film, a wiring layer, or an interlayer insulating film layer is not shown). FIG. 5A is a cross-sectional view taken along a line A-A shown in FIG. 4. FIG. 5B is a cross-sectional view taken along a line B-B shown in FIG. 4. FIG. 5C is a cross-sectional view taken along a line C-C shown in FIG. 4. FIG. 6A is a cross-sectional view taken along a line D-D shown in FIG. 4. FIG. 6B is a cross-sectional view taken along a line E-E shown in FIG. 4. Referring to FIG. 4, there are provided bit lines 14 and insulating film lines 18. The bit lines 14 are embedded in a P-type silicon semiconductor substrate (alternatively, in a P-type region formed in the semiconductor substrate) 10. The insulating film lines 18 are provided on the bit lines 14, and are successively formed in a length direction of the bit line 14 to run in a vertical direction of FIG. 4. In addition, a wiring layer 36 runs on the bit lines 14 in a length direction of the bit lines 14, although the wiring layer 36 is not shown in FIG. 4.

Word lines 20 run in a width direction of the bit lines. A contact hole is provided every several word lines 20. The contact hole is embedded with a plug metal 34, and connects the bit line 14 and the wiring layer 36. Since the bit line 14 is made of a diffusion layer and is high in resistance. For this reason, write and erase characteristics of the memory cells are degraded. Accordingly, in order to prevent the degradation, the bit lines 14 are connected to the wiring layer 36 having a low resistance every several word lines 20.

Referring to FIG. 5A, a description is given of a cross-section between the word lines 20 in a length direction of the word line 20. A trench portion 22 is formed in the semiconductor substrate 10 between the bit lines 14, and a silicon nitride film is provided as an insulating film layer 24 on the trench portion 22. The bit lines 14 are embedded in the semiconductor substrate 10. The silicon oxide film is provided thereon as the insulating film line 18. An interlayer insulating film 30 is provided on the insulating film line 18 and on the insulating film layer 24. The wiring layer 36 is provided on the bit lines 14 provided on the interlayer insulating film 30. A protection film 38 is provided on the top thereof.

Referring to FIG. 5B, a description is given of a cross-section of the word lines 20 in a length direction. The trench portion 22 is not provided in the semiconductor substrate 10 between the bit lines 14, and the channel is formed in the semiconductor substrate 10. The ONO film 12 is provided on the semiconductor substrate 10 between the bit lines 14. A gate electrode 16 is provided between the insulating film lines 18 on the ONO film 12. The bit lines 14 formed in the semiconductor substrate 10 serve as the source/drain regions. The insulating film line 18 is provided on the bit line 14. The word lines 20 are provided on the insulating film line 18 and on the gate electrode 16. The interlayer insulating film 30 is adjacently arranged on the word lines 20, and there is provided a configuration similar to that of FIG. 5A on the interlayer insulating film 30.

Referring to FIG. 5C, a description is given of a cross-section across a contact hole 32 in a length direction of the word lines 20. The configuration between bit lines 14 is similar to that shown in FIG. 5A, and a description thereof is omitted. The contact hole is formed on the bit line 14 and the plug metal 34 is embedded therein. The wiring layer 36 is provided on the plug metal 34, so that the bit line 14 and the wiring layer 36 are connected by the contact hole.

Referring to FIG. 6A, a description is given of a cross-section between the bit lines 14 in a length direction of the bit lines 14. The trench portion 22 is formed between the word lines 20 in the semiconductor substrate 10, and the insulating film layer 24 is formed on the trench portion 22. The trench portion 22 is not provided below the word line 20, and the channel is formed in the semiconductor substrate 10. The ONO film 12 is provided on the semiconductor substrate 10, the gate electrode 16 is provided on the ONO film 12, and the word line 20 is provided on the gate electrode 16. The interlayer insulating film 30 is provided on the word line 20 and on the insulating film layer 24, and the protection film 38 is provided on the interlayer insulating film 30.

Referring to FIG. 6B, a description is given of a cross-section of the bit line 14 in a length direction of the bit lines 14. The bit line 14 is embedded in the semiconductor substrate 10. The insulating film line 18 is successively provided on the bit line 14. The word line 20 is provided on the insulating film line 18. The interlayer insulating film 30 is provided on the word lines 20 and on the insulating film line 18. The wiring layer 36 is provided on the interlayer insulating film 30, and the protection film 38 is provided on the wiring layer 36. The bit line 14 and the wiring layer 36 are connected by the contact holes 32 every several word lines 20, the contact hole 32 being formed in the insulating film line 18 and in the interlayer insulating film 30. The contact hole 32 is embedded with the plug metal 34.

The flash memory employed in the first embodiment includes the trench portion 22 formed in the semiconductor substrate 10 between the bit lines 14 and between the word lines 20. By this configuration, current does not flow at both sides of the word lines 20 in the semiconductor substrate 10, and the charge is not trapped in the ONO film 12 at the both sides of the word line 20, unlike the conventional technique 1. Accordingly, a spacing width between the word lines 20 can be downsized, thereby reducing the memory cell size.

It is difficult to form the insulating film line 18 to be substantially perpendicular in a case where the word line is made on one layer as the conventional technique 2. This is because the embedment of the word lines 20 between the insulating film lines 18 is deteriorated. Therefore, as employed in the first embodiment, it is configured in such a manner that the gate electrode 16 is provided between the insulating film lines 18 and the word lines 20 are provided thereon and in contact therewith. This makes it possible to address the problem of the conventional technique 2. Also, the gate electrode 16 and the word line 20 are provided in contact with each other. This eliminates the necessity of the complex etch process while the trench portions 22 are being formed, unlike the conventional technique 3.

When the insulating film line is made of a thermally-oxidized film, as in the conventional techniques 2 and 3, the insulating film line 18 has slant side surfaces. The channel width becomes narrow due to the bird's beak. Accordingly, it is difficult to reduce the memory cell size. Therefore, it is preferable that the side surfaces of the insulating film lines 18 in a width direction should be substantially perpendicular to a surface of the semiconductor substrate 10. Substantially perpendicular denotes that the width direction of the insulating film lines 18 are configured to be perpendicular, whereas the thermally-oxidized silicon is not formed perpendicularly in the LOCOS structure. This does not produce the bird's beak, thereby making it possible to reduce the memory cell size.

The insulating film line 18 may have insulation properties. However, it is preferable that the insulating film line 18 should include a silicon oxide film. This makes it possible to set a large etch selectively with respect to the silicon semiconductor substrate 10, while the trench portions 22 are being formed.

In addition, in one embodiment, the insulating film layer 24 is provided on the trench portion 22 as employed in the first embodiment. This insulates between the channels with certainty. Also, the insulating film line 18 is made of a silicon oxide film and the insulating film layer 24 is made of a silicon nitride film, thereby making it possible to selectively etch the silicon oxide film with respect to the silicon nitride film. This eliminates the necessity of ensuring an alignment margin between the bit line 14 and the contact hole during the lithography process, thereby making it possible to reduce the memory cell size.

Further, the ONO film 12 is provided between the semiconductor substrate 10 and the gate electrode 16. In this manner, in the flash memory having the ONO film 12, is it possible to prevent the charge from being trapped in the ONO film 12 at both sides of the word line 20.

Next, a description is given of a fabrication method of the flash memory employed in the first embodiment, by reference to FIG. 7 through FIG. 12. In FIG. 7A through FIG. 11C, FIG. 7A, FIG. 8A, FIG. 9A, FIG. 10A, and FIG. 11A are cross-sectional views taken along a line A-A shown in FIG. 4. FIG. 7B, FIG. 8B, FIG. 9B, FIG. 10B, and FIG. 11B are cross-sectional views taken along a line B-B shown in FIG. 4. FIG. 7C, FIG. 8C, FIG. 9C, FIG. 10C, and FIG. 11C are cross-sectional views taken along a line D-D shown in FIG. 4. FIG. 12 is a cross-sectional view taken along a line C-C shown in FIG. 4.

Figure 7A:
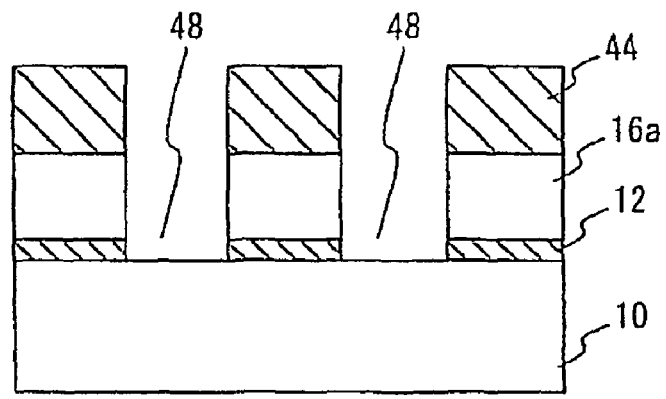
FIG. 7A through FIG. 7C are first cross-sectional views illustrating a fabrication method of the flash memory in accordance with the first embodiment of the present invention.
Figure 7B:
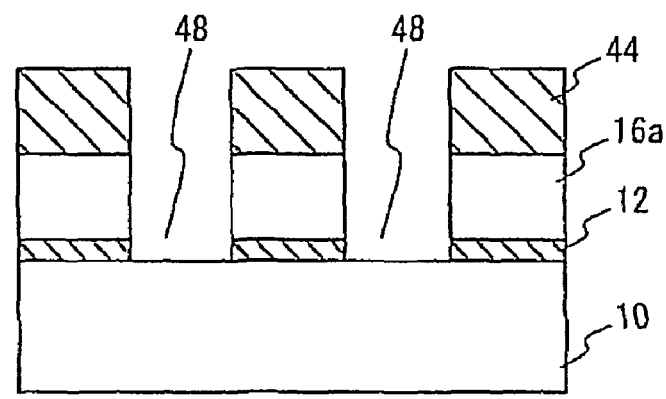
Figure 7C:
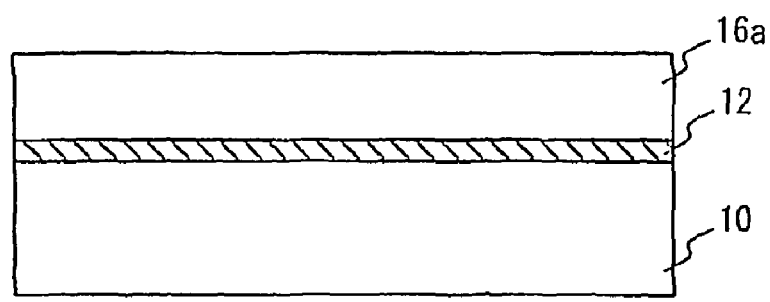

Referring to FIG. 7A through FIG. 7C, the tunnel oxide film (silicon oxide film) is formed by a thermal oxidation method, and the trap layer (silicon nitride film) and the top oxide film (silicon oxide film) are deposited by Chemical Vapor Deposition (CVD), on the P-type silicon substrate 10 (alternatively, on the P-type region in the semiconductor substrate) as the ONO film 12. A polysilicon film is formed on the ONO film 12 as a first metal layer 16a so as to form the gate electrodes 16. A photoresist 44 having openings in regions where the bit lines 14 are to be formed is formed on the first metal layer 16a. By using the photoresist 44 as an etching mask, the first metal layer 16a and the ONO film 12 are etched to form openings 48. By doing this, as shown in FIG. 7A and FIG. 7B, the openings 48 are formed in the regions where the bit lines 14 and the insulating film line 18 are to be formed. As shown in FIG. 7C, the first metal layer 16a is successively provided in a region where the bit line 14 is to be formed. Side surfaces of the openings 48 are formed to be substantially perpendicular to the surface of the semiconductor substrate 10. Here, as an example, the first metal layer 16a is 100 nm in thickness, the opening 48 is 70 nm in width (namely, bit line width), and the spacing width between the bit lines is 160 nm.

Figure 8A:
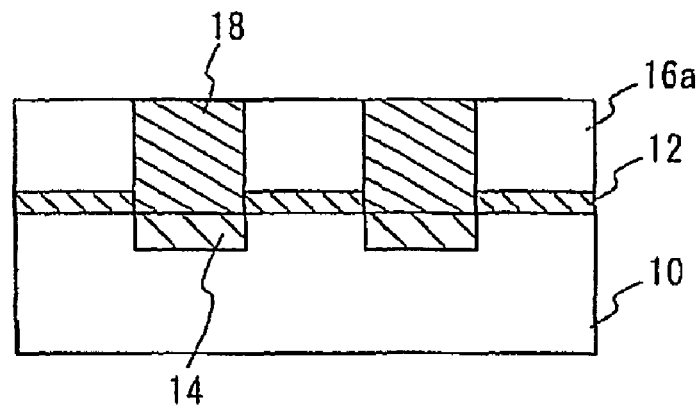
FIG. 8A through FIG. 8C are second cross-sectional views of the flash memory in accordance with the first embodiment of the present invention.
Figure 8B:
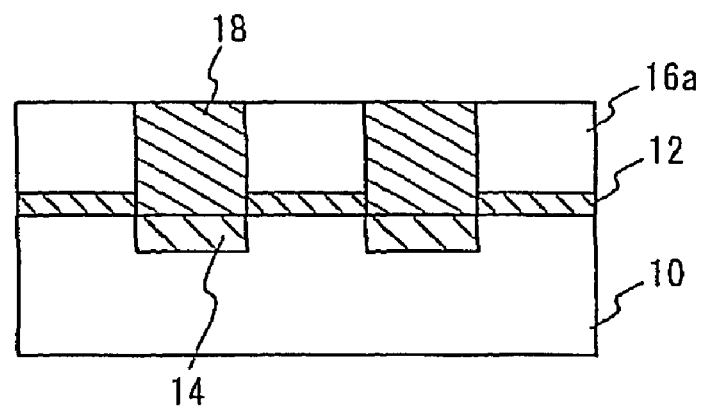
Figure 8C:
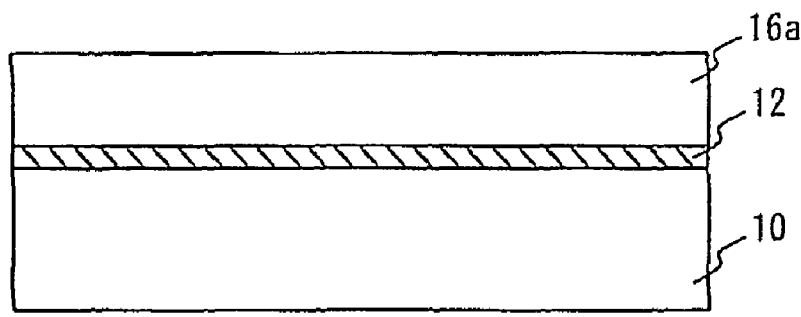

Referring to FIG. 8A through FIG. 8C, for example, arsenic ions are implanted in the semiconductor substrate 10, by using the photoresist 44 as an etching mask, and then the photoresist 44 is removed. Subsequently, the thermal treatment is performed to form the N-type bit lines 14 in the semiconductor substrate 10. With the use of a high-density plasma CVD apparatus, the silicon oxide film layer having a thickness of approximately 180 nm is deposited on the openings 48 and on the first metal layer 16a so as to embed in the openings 48. By employing the high-density plasma CVD apparatus, it is possible to embed the silicon oxide film 18 with certainty in the openings 48 having a large aspect ratio of 2.7. The silicon oxide layer is polished by use of Chemical Mechanical Polishing (CMP). In this manner, the insulating film line 18 embedded in the openings 48 is formed on the bit line 14. Here, the first metal layer 16a is approximately 90 nm in thickness.

As stated, the bit line 14 and the insulating film line 18 can be formed in a self-aligned manner. It is therefore possible to form the insulating film line 18 successively in a direction of the bit lines 14. In addition, by forming the insulating film line 18 in the opening 48, it is possible to form the side surfaces of the insulating film line 18 substantially perpendicular to the semiconductor substrate 10. This makes it possible to miniaturize the memory cells. Additionally, the insulating film line is formed by CVD, thereby allowing the memory cell size to be further reduced, with no bird's beak.

Figure 9A:
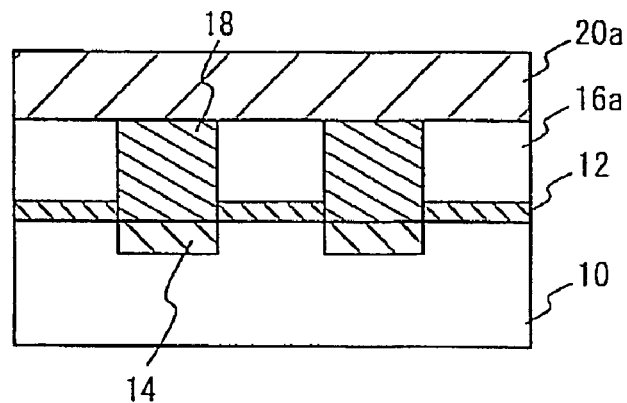
FIG. 9A through FIG. 9C are third cross-sectional views illustrating the fabrication method of the flash memory in accordance with the first embodiment of the present invention.
Figure 9B:
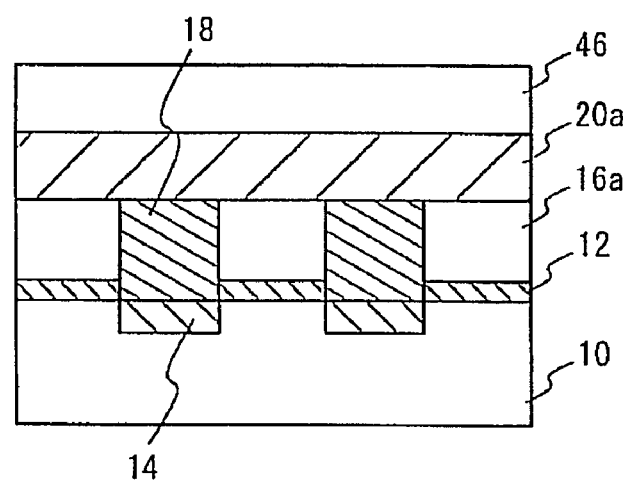
Figure 9C:
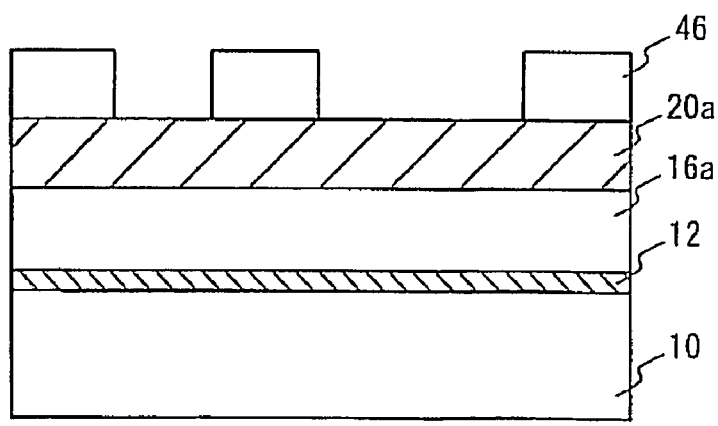

Referring to FIG. 9A through FIG. 9C, a second metal layer 20a is formed by use of a polysilicon film on the insulating film line 18 and on the first metal layer 16a, so as to form the word lines 20. The photoresist 46, having openings in regions other than the regions where the word lines 20 are to be formed, is formed on the second metal layer 20a. As shown in FIG. 9A, the photoresist 46 is not formed in a region corresponding to the region between the word lines 20. As shown in FIG. 9B, the photoresist 46 is formed in the region where the word line 20 is to be formed. Here, the second metal layer 20a is 100 nm in thickness (namely, film thickness of the word line), the word line is 75 nm in width, and the spacing width between the word lines is 75 nm.

Figure 10A:
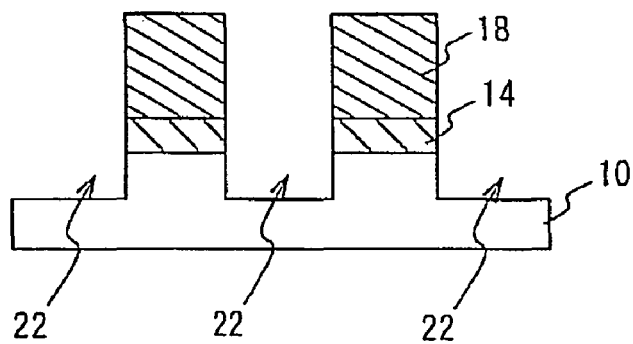
FIG. 10A through FIG. 10C are fourth cross-sectional views illustrating the fabrication method of the flash memory in accordance with the first embodiment of the present invention.
Figure 10B:
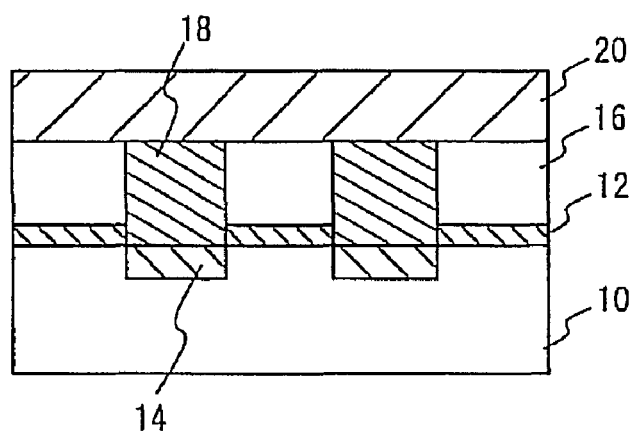
Figure 10C:
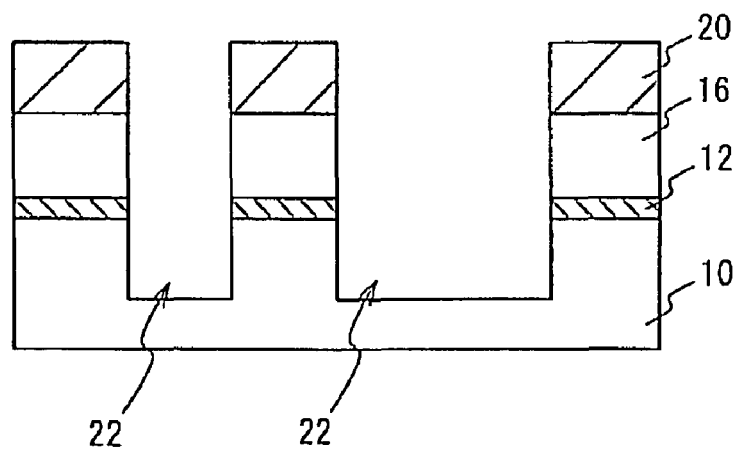

Referring to FIG. 10A through FIG. 10C, the second metal layer 20a, the first metal layer 16a, and the ONO film 12 are etched by using the photoresist 46 as an etching mask. Then, the trench portion 22 of 40 nm in depth is formed in the semiconductor substrate 10, between the bit lines 14 and between the word lines 20. At this time, as shown in FIG. 10A, the second metal layer 20a and the first metal later 16a provided between the bit lines 14 are etched away in the region between the word lines 20. Then, the trench portion 22 is formed between the bit lines 14 in the semiconductor substrate 10. The insulating film lines 18 are provided on the bit lines 14. The insulating film line 18 is composed of the silicon oxide film. Accordingly, it is possible to remain the insulating film lines 18, by selectively etching the second metal layer 20a and the first metal layer 16a, which are respectively made of a polysilicon, whereas the insulating film line 18 is made of a silicon oxide film. It is therefore possible to prevent the bit lines 14 from being etched, while the trench portions 22 are being formed in the semiconductor substrate 10.

As shown in FIG. 10B, the first metal layer 16a and the second metal layer 20a remain in the region where the word line 20 is formed, and the gate electrode 16 and the word line 20 are respectively formed. Accordingly, the gate electrode 16 is formed above the semiconductor substrate 10 between the bit lines 14, and the word line 20 is formed to be in contact with the gate electrode 16 and to run in a width direction of the bit lines 14. Also, the trench portion 22 is formed in the semiconductor substrate 10 between the bit lines 14 and between the word lines 20. The trench portion 22 is formed by etching the semiconductor substrate 10 by using at least the insulating film line 18 as a mask.

As seen in the conventional technique 3, in a case where a silicon oxide film is provided between the first metal layer 16a and the second metal layer 20a, subsequent to the etch process of the second metal layer 20a, the etch process stops at the silicon oxide film, or the etch process will take time. Therefore, the silicon oxide film is etched under a different condition, and in addition, the first metal layer 16a has to be etched. In the first embodiment, it is possible to perform the etch process in a continuous manner to the ONO film 12, by providing the word lines 20 on the gate electrode 16, that is, providing the second metal layer 20a on the first metal layer 16a, thereby eliminating the necessity of the above-described complex etch process.

As stated heretofore, the bit lines 14 and the insulating film lines 18 are formed in a self-aligned manner with the openings 48 formed in the first metal layer 16a. In addition, the second metal layer 20a is formed thereon. Subsequently, the etch process is performed for forming the word lines 20, the gate electrodes 16, and the trench portions 22 with the use of an identical mask. This makes it possible to form the word lines 20, the gate electrodes 16, and the trench portions 22 in a self-aligned manner. It is therefore possible to reduce the number of steps in the fabrication process. It is also possible to reduce the sizes of the memory cells with disregard to misalignment during the lithography process.

Figure 11A:
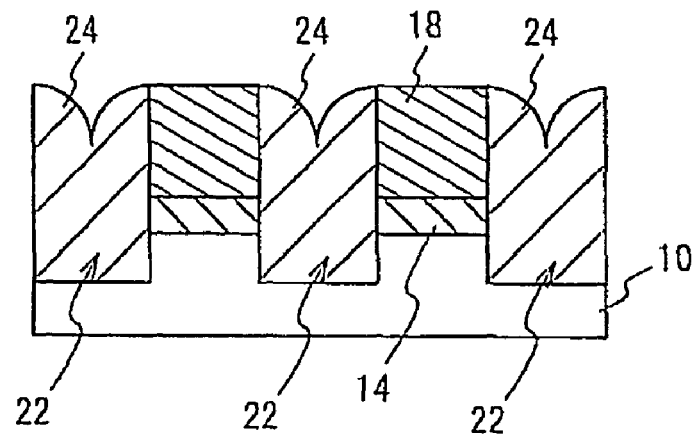
FIG. 11A through FIG. 11C are fifth cross-sectional views illustrating the fabrication method of the flash memory in accordance with the first embodiment of the present invention.
Figure 11B:
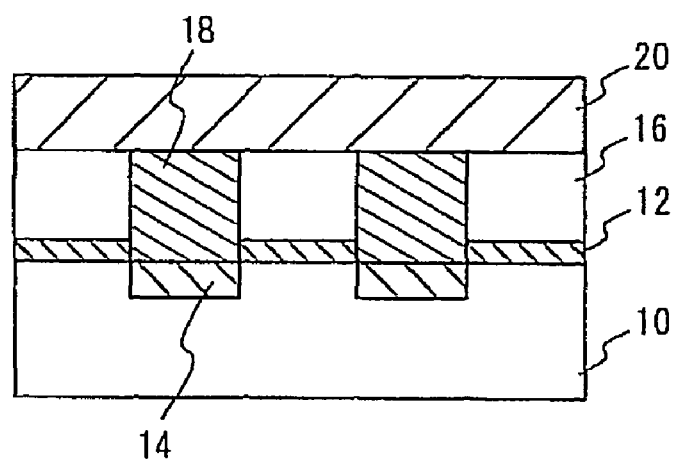
Figure 11C:
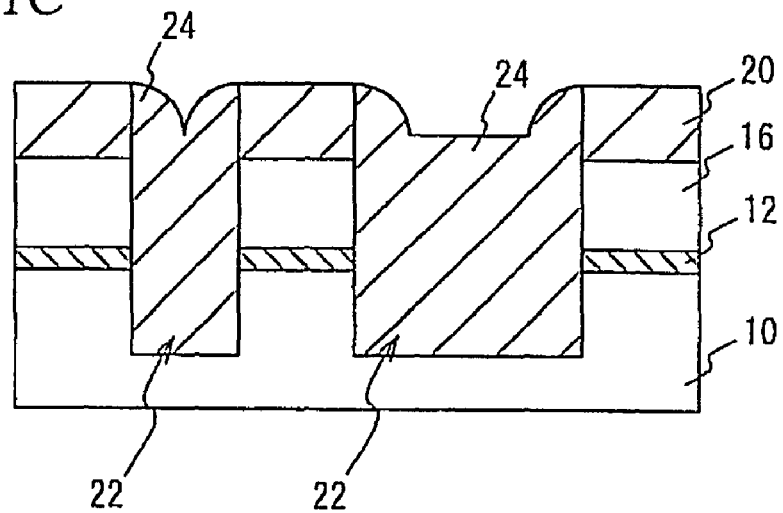

Referring to FIG. 11A through FIG. 11C, a silicon nitride film of 100 nm in thickness is formed on the trench portion 22, as the insulating film layer 24, to embed in the trench portion 22, by use of CVD or the high-density plasma CVD apparatus. Subsequently, the whole surface is etched, or polished by CMP to embed the insulating film layer 24. The insulating film layer 24 is capable of isolating elements between the channels below the word lines 20 with more certainty.

Figure 12A:
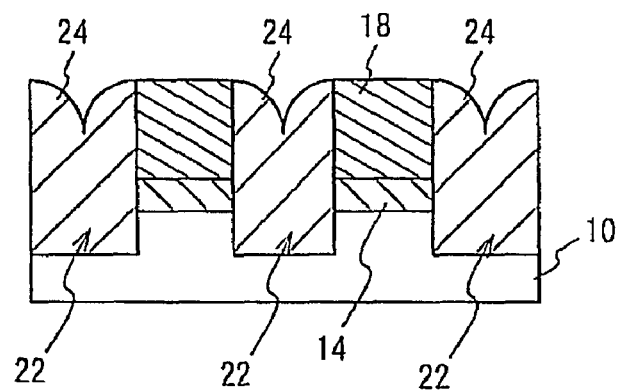
FIG. 12A through FIG. 12C are sixth cross-sectional views illustrating the fabrication method of the flash memory in accordance with the first embodiment of the present invention.
Figure 12B:
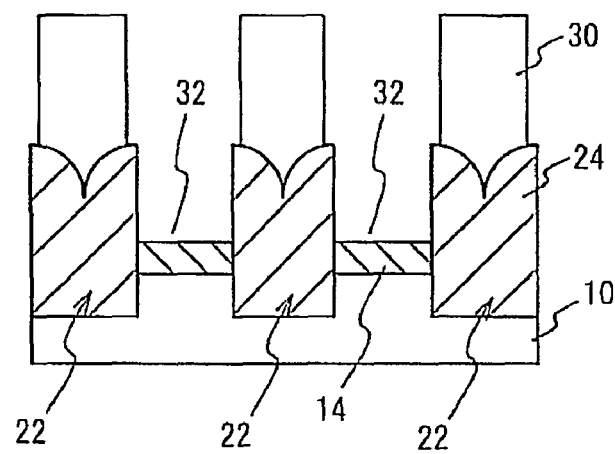
Figure 12C:
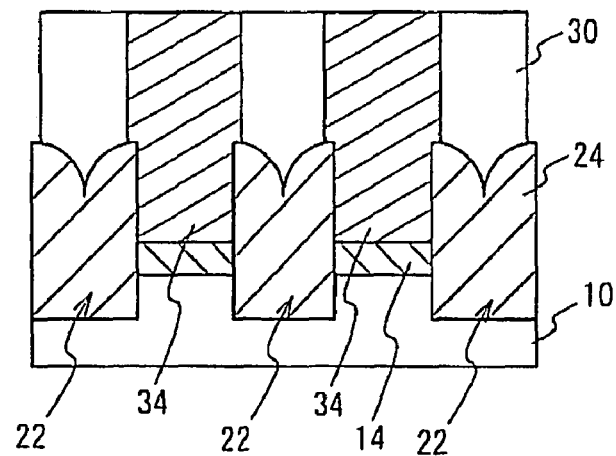

Next, referring to FIG. 12A through FIG. 12C, a description is given of the region where the contact hole 32 is formed. FIG. 12A is a view illustrating an identical fabrication process to FIG. 11A through FIG. 11C. Before the contact holes are formed, FIG. 12A is identical to FIG. 11A, which is a cross-sectional view taken along a line A-A shown in FIG. 4. Referring to FIG. 12B, a silicon oxide film of, for example, Boro-Phospho Silicated Glass (BPSG) or the like is deposited by CVD, as the interlayer insulating film 30 on the insulating film layer 24 and on the insulating film line 18. The interlayer insulating film 30 and the insulating film line 18 between the insulation layers 24 are etched by using the photoresist as an etching mask, so as to form the contact holes 32 connected to the bit lines 14.

The interlayer insulating film 30 and the insulating film line 18 are made of silicon oxide films, and the insulating film layer 24 is made of a silicon nitride film. It is therefore possible to selectively etch the silicon oxide film with respect to the silicon nitride film. For this reason, the contact hole 32 does not deviate from the bit line 14, even if the opening in the photoresist provided for forming the contact hole 32 deviates from the bit line 14. If the contact hole 32 deviates from the bit line 14, junction current will flow between the bit line 14 and the semiconductor substrate 10. The junction current can be prevented in the flash memory employed in the first embodiment. This makes it possible to reduce the size of the memory cell without the necessity of ensuring an alignment margin during the lithography process of the bit line 14 and the contact hole 32.

Referring to FIG. 12C, a metal of, for example, Ti/WN and W or Ti/TiM and W is embedded in the contact hole 32 to form the plug metal 34. Subsequently, the wiring layer 36 and the protection film 38 are formed, and the flash memory employed in the first embodiment is formed.

Second Embodiment

Figure 13A:
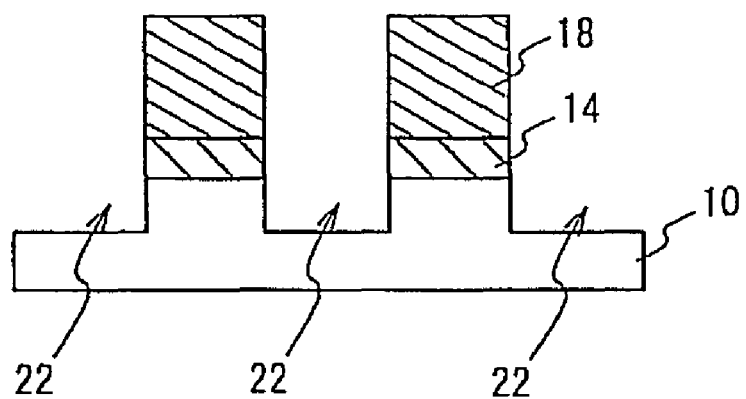
FIG. 13A and FIG. 13B are first cross-sectional views illustrating the fabrication method of the flash memory in accordance with a second embodiment of the present invention.
Figure 13B:
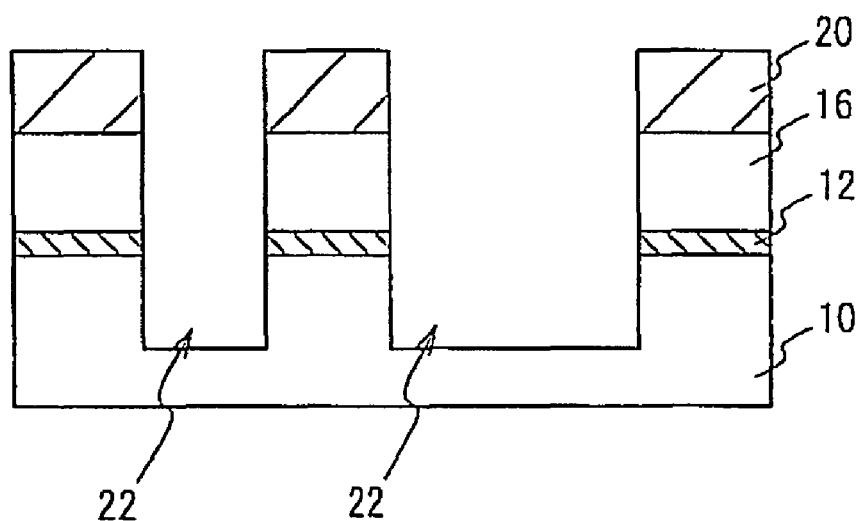
Figure 14A:
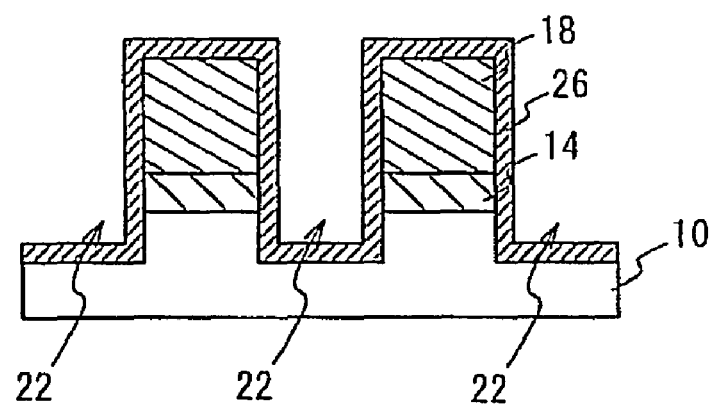
FIG. 14A and FIG. 14B are second cross-sectional views illustrating the fabrication method of the flash memory in accordance with the second embodiment of the present invention.
Figure 14B:
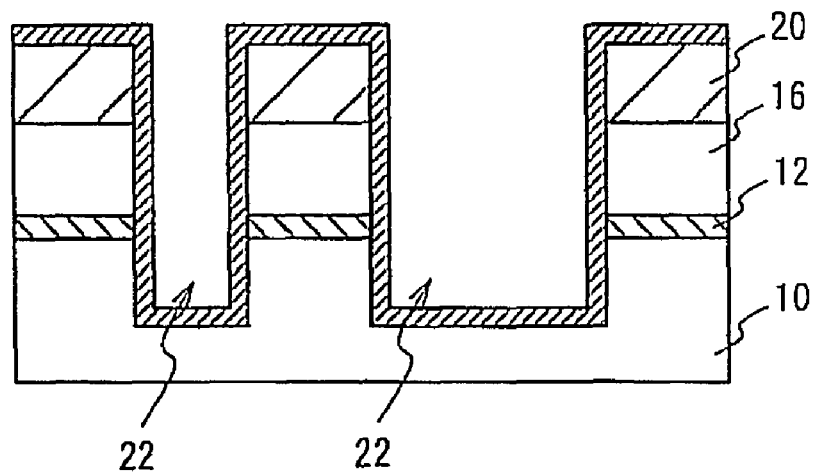
Figure 15A:
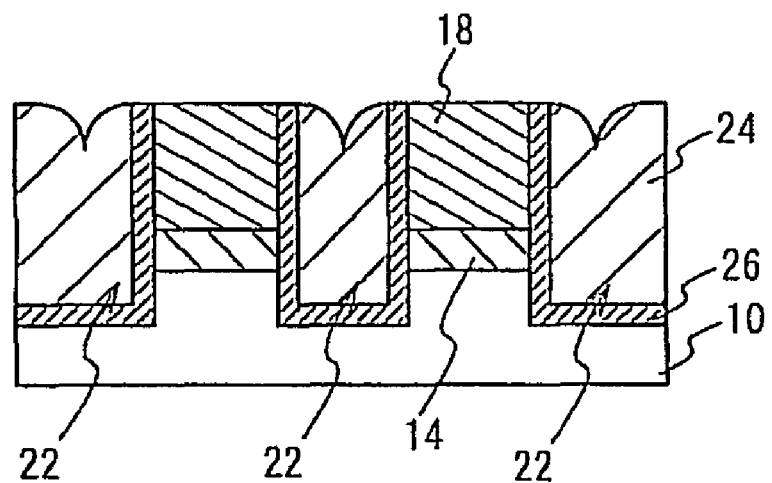
FIG. 15A and FIG. 15B are third cross-sectional views illustrating the fabrication method of the flash memory in accordance with the second embodiment of the present invention.
Figure 15B:
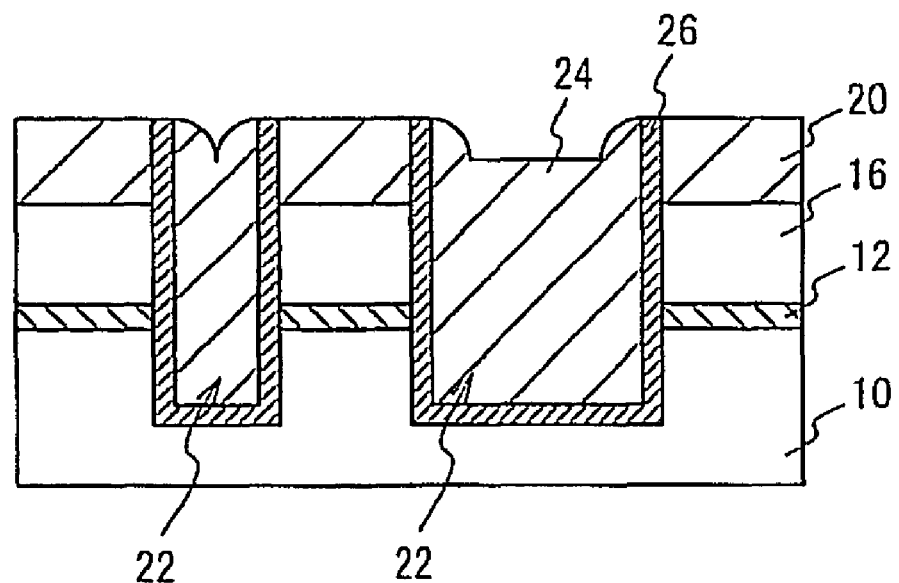

A second embodiment of the present invention is an exemplary embodiment of the flash memory having a barrier layer provided at the bottom and on sides of the insulating film layer 24. FIG. 13A through FIG. 15B are views illustrating the fabrication method of the flash memory in accordance with the second embodiment of the present invention. FIG. 13A, FIG. 14A, and FIG. 15A are cross-sectional views taken along a line A-A shown in FIG. 4. FIG. 13B, FIG. 14B, and FIG. 15B are cross-sectional views taken along a line D-D shown in FIG. 4. In FIG. 13A and FIG. 13B, the fabrication process in FIG. 10A through FIG. 10C is completed as described in the first embodiment. Hereinafter, in the second embodiment, the same components and configurations as those of the first embodiment have the same reference numerals and a detailed explanation will be omitted. Referring to FIG. 14A and FIG. 14B, a barrier layer 26 is formed by CVD, on the trench portion 22 and side surfaces thereof, and on the side surfaces of the ONO film 12, the insulating film line 18, the gate electrode 16 and the word line 20. The barrier layer 26 is 30 nm in thickness. A silicon nitride film is deposited on the barrier layer 26, as the insulating film layer 24, by CVD or by using a high-density plasma CVD apparatus. Then, the whole surface is etched, or is polished by CMP, thereby, embedding the insulating film layer 24 and the barrier layer 26. Subsequently, the fabrication processes identical to those shown in FIG. 12A through FIG. 12C are performed to complete the flash memory employed in the second embodiment.

Also, in the second embodiment of the present invention, it is possible to obtain the same effects as those obtained in the first embodiment. In addition, the flash memory employed in the second embodiment includes the barrier layer 26 of (including) the silicon oxide film provided between the trench portion 22 and the insulating film layers 24 composed of (including) the silicon nitride film. This makes it possible to prevent the silicon nitride film from peeling off due to the stress in the silicon nitride film. It is further possible to prevent hydrogen in the silicon oxide film from diffusing into the ONO film 12, thereby preventing the degradation of device characteristics. In one embodiment, the barrier layer 26 is formed on at least the trench portion 22 for the purpose of preventing the silicon nitride film from peeling off, and is formed on at least the side surfaces of the ONO film 12 for the purpose of serving as a barrier of the ONO film 12.

Third Embodiment

Figure 16A:
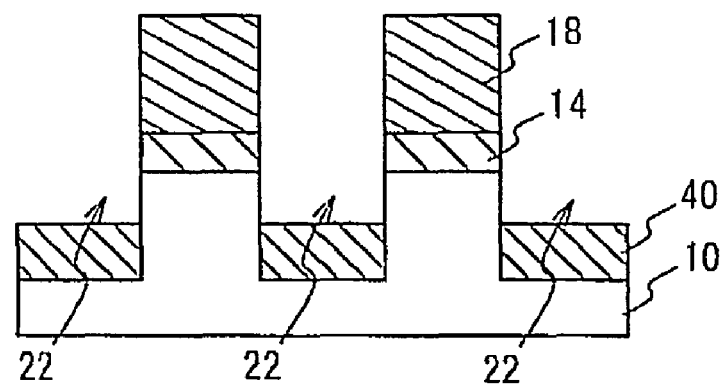
FIG. 16A and FIG. 16B are first cross-sectional views illustrating the fabrication method of the flash memory in accordance with a third embodiment of the present invention.
Figure 16B:
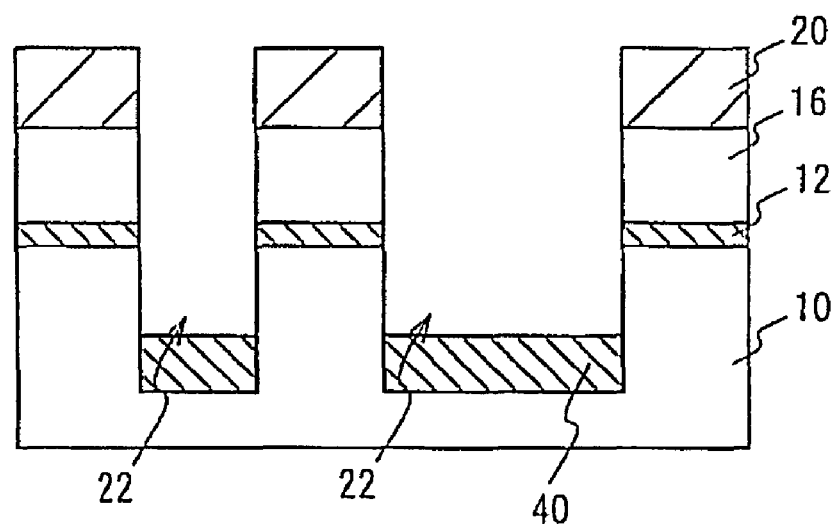
Figure 17A:
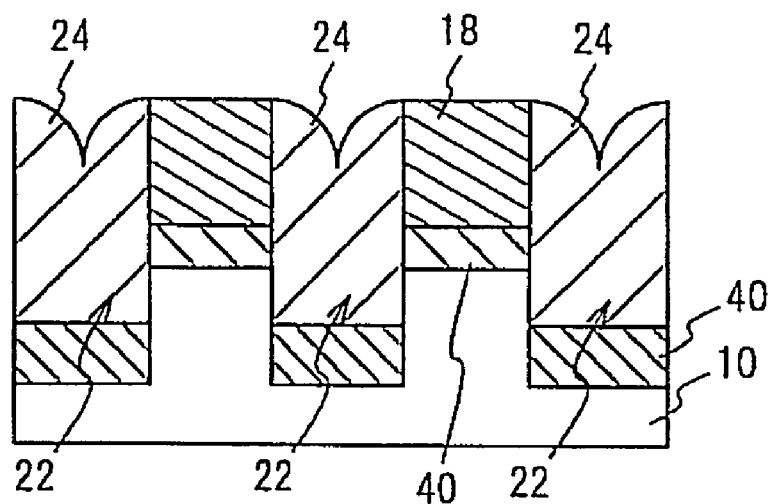
FIG. 17A and FIG. 17B are second cross-sectional views illustrating the fabrication method of the flash memory in accordance with the third embodiment of the present invention.
Figure 17B:
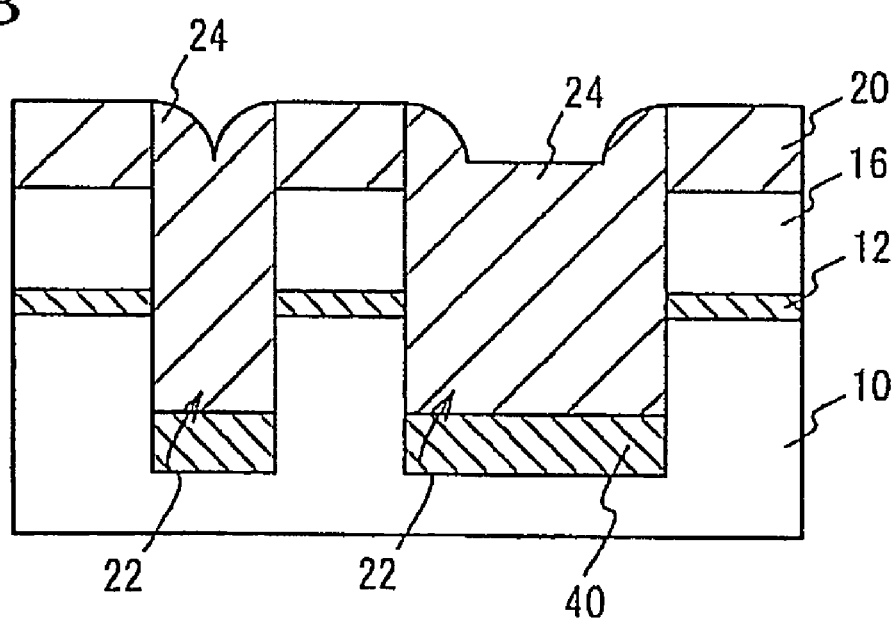

A third embodiment of the present invention is an exemplary embodiment of the flash memory having a channel-cut region 40 provided in the trench portion 22. FIG. 16A through FIG. 17B are views illustrating the fabrication method of the flash memory in accordance with the third embodiment of the present invention. FIG. 16A and FIG. 17A are cross-sectional views taken along a line A-A shown in FIG. 4. FIG. 16B and FIG. 17B are cross-sectional views taken along a line D-D shown in FIG. 4. Referring now to FIG. 16A and FIG. 16B, firstly, the fabrication process in FIG. 10A through FIG. 10C is completed as described in the first embodiment. Hereinafter, in the third embodiment, the same components and configurations as those of the first embodiment have the same reference numerals and a detailed explanation will be omitted. Subsequently, for example, boron ions are implanted in the semiconductor substrate 10 in the trench portion 22, by using the insulating film lines 18 and the word lines 20 as a mask, and the P-type channel-cut region (having an opposite type impurity to the bit lines 14) 40 is formed. Ions are implanted, for example, at an implantation energy of 65 keV and at a dose of 1E13 cm$^{-3}$.

Referring to FIG. 17A and FIG. 17B, the silicon nitride film is formed as the insulating film layer 24 on the trench portion 22. Then, the flash memory employed in the third embodiment is completed by performing the processes identical to those shown in FIG. 12A through FIG. 12C.

In the flash memory employed in the third embodiment, it is possible to obtain the same effects as those obtained in the first embodiment. In addition, the flash memory employed in the third embodiment includes the P-type channel-cut region 40 in the trench portion 22, thereby ensuring the element isolation between the channels below the word line 20. Furthermore, the channel-cut region 40 is formed by using the insulating film lines 18 and the word lines 20 as a mask, thereby making it possible to form the channel-cut regions 40 and the trench portions 22 in a self-aligned manner. It is also possible to reduce the memory cell size with disregard to misalignment during the lithography process.

Fourth Embodiment

Figure 18A:
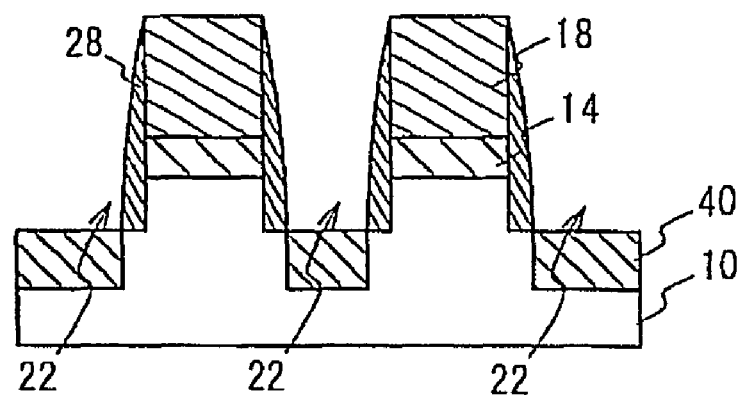
FIG. 18A and FIG. 18B are first cross-sectional views illustrating the fabrication method of the flash memory in accordance with a fourth embodiment of the present invention.
Figure 18B:
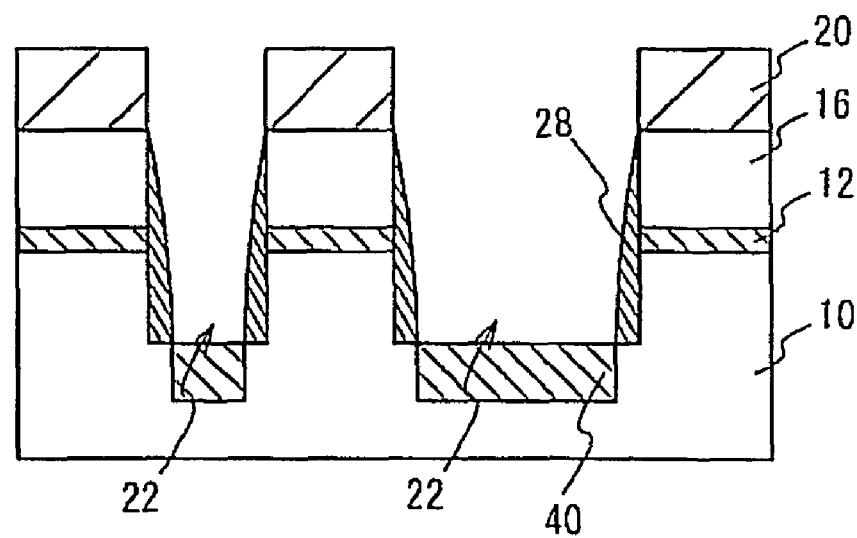
Figure 19A:
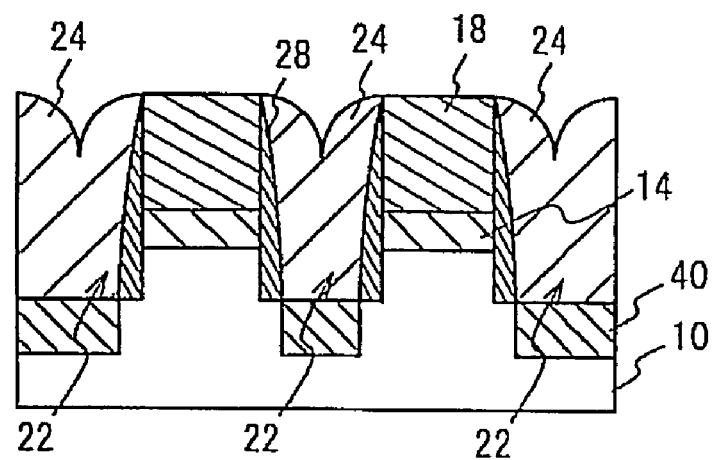
FIG. 19A and FIG. 19B are second cross-sectional views illustrating the fabrication method of the flash memory in accordance with the fourth embodiment of the present invention.
Figure 19B:
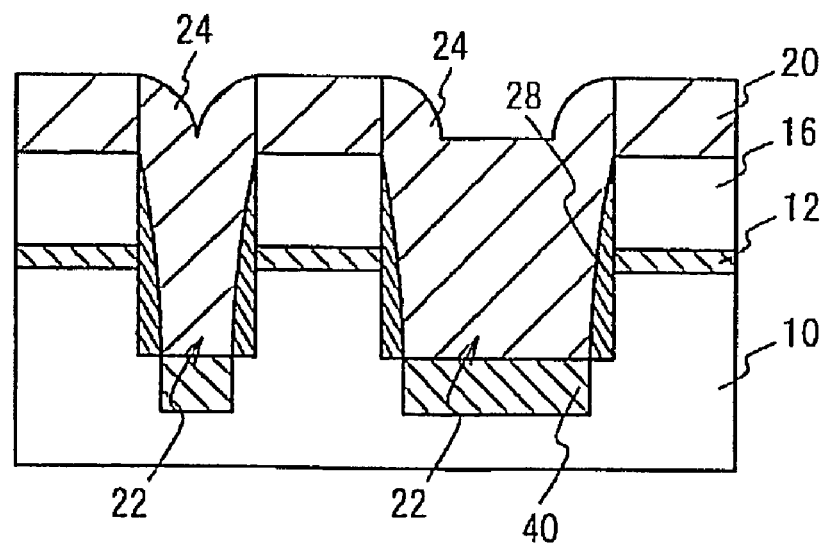

A third embodiment of the present invention is an exemplary embodiment of the flash memory having sidewalls 28 provided on side surfaces of the trench portion 22 and the channel-cut region 40 provided in the trench portion 22. FIG. 18A through FIG. 19B are views illustrating the fabrication process of the flash memory in accordance with the fourth embodiment of the present invention. FIG. 18A and FIG. 19A are cross-sectional views taken along a line A-A shown in FIG. 4. FIG. 18B and FIG. 19B are cross-sectional views taken along a line D-D shown in FIG. 4. Referring to FIG. 18A and FIG. 18B, firstly, the fabrication process in FIG. 10A through FIG. 10C is completed as described in the first embodiment. Hereinafter, in the fourth embodiment, the same components and configurations as those of the first embodiment have the same reference numerals and a detailed explanation will be omitted. Subsequently, the sidewalls 28 are formed on the side surfaces of the trench portion 22, by use of the sidewall method. It is configured such that each of the sidewalls 28 is 15 nm in width. The sidewalls 28 are formed of, for example, a silicon oxide film or silicon nitride film. For example, boron ions are implanted in the semiconductor substrate 10 under the same conditions as employed in the third embodiment, by using the insulating film lines 18, the word lines 20, and the sidewalls 28 as a mask. Then, the thermal treatment is performed. In this manner, the P-type channel-cut region (an opposite type impurity to the bit line 14) 40 is formed.

Referring now to FIG. 19A and FIG. 19B, the silicon nitride film is formed in the trench portion 22 as the insulating film layer 24, in a similar manner to the processes shown in FIG. 11A through FIG. 11C. Then, the flash memory employed in the fourth embodiment is completed by performing the processes identical to those shown in FIG. 12A through FIG. 12C.

In the flash memory employed in the fourth embodiment, it is possible to obtain the same effects as those obtained in the third embodiment. In addition, it is possible to ensure a spacing width between the channel-cut region 40 and the channel in the flash memory employed in the fourth embodiment, thereby preventing the channel from narrowing due to a depletion layer extending from the channel-cut region 40. Furthermore, the channel-cut region 40 is formed by using the insulating film lines 18, the word lines 20, and the sidewalls 28 as a mask, thereby making it possible to form the channel-cut regions 40 and the trench portions 22 in a self-aligned manner. This also makes it possible to reduce the number of steps in the fabrication process. It is also possible to reduce the memory cell size with disregard to the misalignment during the lithography process.

It is also possible to provide the channel-cut region 40 as employed either in the third or fourth embodiment, in the flash memory having the barrier layer 26 as employed in the second embodiment.

According to a first aspect of the present invention, there is preferably provided a semiconductor device including: bit lines formed in a semiconductor substrate; insulating film lines located on the bit lines to successively run in a length direction of the bit lines; gate electrodes located above the semiconductor substrate between the bit lines; and word lines located on the gate electrodes to run in a width direction of the bit lines; a trench region formed between the bit lines and the between word lines in the semiconductor substrate.

In the above-described semiconductor device, side surfaces of the insulating film lines may be substantially perpendicular to a surface of the semiconductor substrate. According to the present invention, the memory cells can be miniaturized with no bird's beak.

In the above-described semiconductor device, each of the insulating film lines may include silicon oxide film. According to the present invention, it is possible to set a large etch selectivity with respect to the silicon semiconductor substrate, in forming the trench portion in the semiconductor substrate.

The above-described semiconductor device may further include an insulating film layer provided on the trench region. According to the present invention, it is possible to isolate elements between channels with certainty.

The above-described semiconductor device may further include a barrier layer provided between the trench region and the insulating film layer. The insulating film layer may include a silicon nitride film, and the barrier layer includes a silicon oxide film. According to the present invention, it is possible to prevent the silicon nitride film from peeling off or the like due to the stress. It is also possible to prevent hydrogen in the silicon nitride film from diffusing into the ONO film and to prevent the degradation of device characteristics.

The above-described semiconductor device may further include a channel-cut region formed in the semiconductor substrate in the trench region, the channel-cut region having an opposite type impurity to those of the bit lines. According to the present invention, it is possible to isolate elements between channels with certainty.

The above-described semiconductor device may further include sidewalls formed on sides of the trench region. According to the present invention, it is possible to ensure a spacing width between the channel-cut region and the channel, thereby preventing the channel from being narrowed by a depletion layer that extends from a P-type region.

In the above-described semiconductor device, ONO films located between the semiconductor substrate and the gate electrodes. According to the present invention, it is possible to prevent the charge from being trapped in the ONO film on both sides of the word lines.

According to a second aspect of the present invention, there is preferably provided a method of fabricating a semiconductor device including: forming bit lines in a semiconductor substrate; forming insulating film lines on the bit lines to successively run in a length direction of the bit lines; forming gate electrodes above the semiconductor substrate between the bit lines; forming word lines on the gate electrodes to run in a width direction of the bit lines; and forming a trench region between the bit lines and between the word lines in the semiconductor substrate. Forming the trench region may include etching the semiconductor substrate by using at least the insulating film lines as an etching mask.

In the above-described method, forming the bit lines may include implanting ions in the semiconductor substrate having openings formed in a first metal, of which the gate electrodes are to be composed; and forming the insulating film lines may include forming a layer of the insulating film lines on the openings and on the first metal layer, and polishing the layer of the insulating film lines to the first metal layer. According to the present invention, the bit lines and the insulating film lines can be formed in a self-aligned manner. It is therefore possible to form the insulating film lines successively in a length direction of the bit lines. It is also possible to configure side surfaces of the insulating film lines to be substantially perpendicular to the semiconductor substrate, by forming the insulating film lines in the first metal layer. This makes it possible to miniaturize the memory cells.

In the above-described method, forming the insulating film lines may include forming a silicon oxide film by CVD. According to the preset invention, the sizes of the memory cells can be further reduced, with no bird's beaks.

The above-described method may further include forming an insulating film layer on the trench region. According to the present invention, it is possible to isolate elements between the channels with more certainty.

The above-described method may further include forming a barrier layer that includes a silicon oxide film on the trench region. Forming the insulating film layer includes forming a silicon nitride film on the barrier layer. According to the present invention, it is possible to prevent the silicon nitride from peeling off due to the stress. It is also possible to prevent hydrogen in the silicon nitride film from diffusing into the ONO film and to prevent the degradation of device characteristics.

The above-described method may further include forming contact holes connected to the bit lines in the insulating film lines located between the insulating film layers. According to the present invention, it is possible to selectively etch the insulating film lines with respect to the insulating film layer, while the contact holes are being formed. This eliminates the necessity of ensuring an alignment margin between the bit lines and the contact holes during the lithography process, thereby allowing the memory cell size to be reduced.

The above-described method may further include forming a channel-cut region having an opposite type impurity to those of the bit lines, in the semiconductor substrate in the trench region. According to the present invention, it is possible to isolate the elements between the channels with more certainty.

In the above-described method, forming the channel-cut region includes implanting ions in the trench region by using the insulating film lines as a mask. According to the present invention, the channel-cut region and the trench region can be formed in a self-aligned manner. It is therefore possible to reduce the number of steps in the fabrication process. Also, the memory cells can be miniaturized with disregard to a misalignment during the lithography process.

The above-described method may further include forming sidewalls on sides of the trench region. Forming the channel-cut region may include implanting ions in the trench region by using the insulating lines, word lines, and the sidewalls as a mask. According to the present invention, it is possible to ensure a spacing width between the channel-cut region and the channel, thereby preventing the channel from being narrowed by the depletion layer that extends from a P-type region. It is also possible to form the channel-cut region and the trench region in a self-aligned manner, thereby reducing the number of steps in the fabrication process. Also, the memory cells can be miniaturized with disregard to a misalignment during the lithography process.

The above-described method may further include forming an ONO film on the semiconductor substrate. Forming the gate electrodes may include forming the gate electrodes on the ONO film. According to the present invention, it is possible to prevent the charge from being trapped in the ONO film provided at both sides of the word lines in a flash memory having the ONO film.

Although a few preferred embodiments of the present invention have been shown and described, it would be appreciated by those skilled in the art that changes may be made in these embodiments without departing from the principles and spirit of the invention, the scope of which is defined in the claims and their equivalents.

Fifth Embodiment

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip.

In addition, flash memory offers fast read access times and better shock resistance than traditional hard disks. These characteristics explain the popularity of flash memory for applications such as storage on battery-powered devices (e.g., cellular phones, mobile phones, IP phones, wireless phones.).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array.

Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 20:
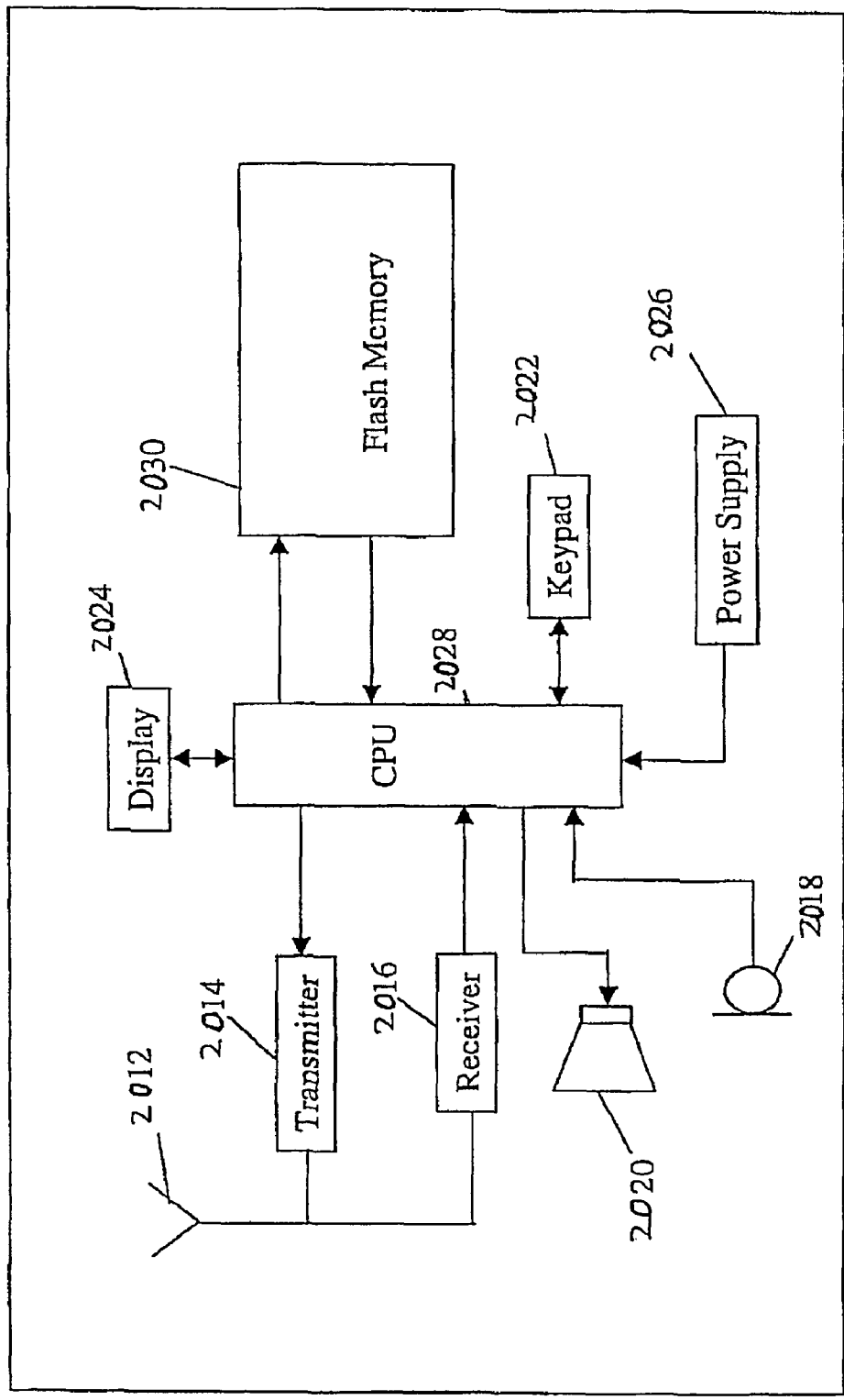
FIG. 20 illustrates a block diagram of a conventional portable phone, upon which embodiments can be implemented.

FIG. 20 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes a semiconductor device including bit lines formed in a semiconductor substrate, insulating film lines located on the bit lines to successively run in a length direction of the bit lines, gate electrodes located above the semiconductor substrate between the bit lines, and word lines located on the gate electrodes to run in a width direction of the bit lines, a trench region formed between the bit lines and the between word lines in the semiconductor substrate, and there is also provided a fabrication method therefor. According to the present invention, it is possible to provide a semiconductor device where elements can be isolated between the word lines and memory cells can be miniaturized, and to provide a fabrication method therefor.

As a result, the flash memory 2030 is able to isolate elements between word lines and allowing further miniaturization of memory cells. Consequently, embodiments allow a greater memory density for flash memory devices, which allows various devices, such as mobile phones, cellular phones, internet protocol phones, and/or wireless phones to store more application programs and have a wider range of functionality. Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Sixth Embodiment

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 21:
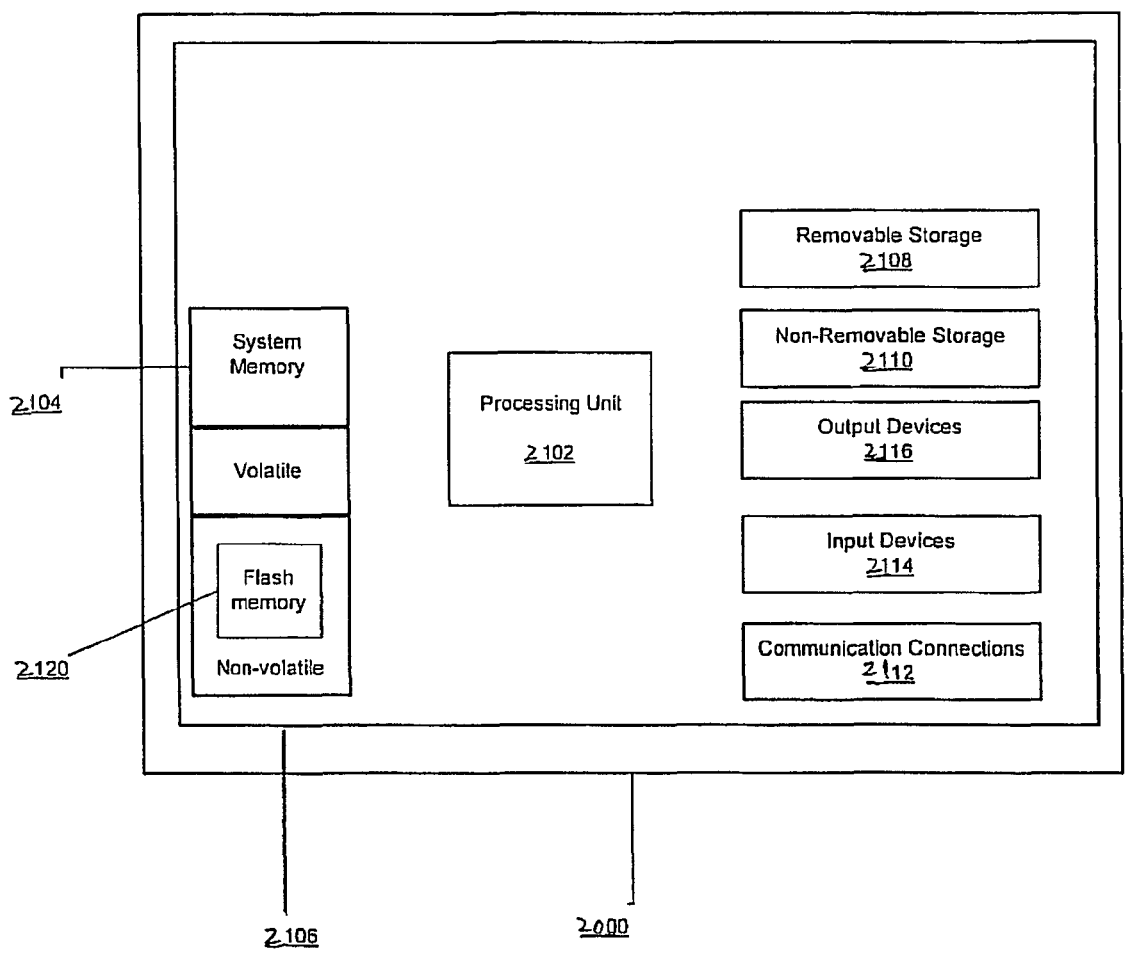
FIG. 21 illustrates a block diagram of a computing device, upon which embodiments of the present claimed subject matter can be implemented.

FIG. 21 illustrates a block diagram of a computing device 2100, upon which embodiments of the present claimed subject matter can be implemented. Although computing device 2100 is shown and described in FIG. 21 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 21.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 21 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 21 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: bit lines formed in a semiconductor substrate; insulating film lines located on the bit lines to successively run in a length direction of the bit lines; gate electrodes located above the semiconductor substrate between the bit lines; word lines located on the gate electrodes to run in a width direction of the bit lines; and a trench region formed between the bit lines and the between word lines in the semiconductor substrate. As a result, the flash memory 2120 is able to isolate elements between word lines and allowing further miniaturization of memory cells. Consequently, embodiments allow a greater memory density for flash memory devices, which allows various devices, such as mobile phones, personal digital assistants, set-top boxes, digital video recorders, networking and telecommunication equipments, printers, computer peripherals, automotive navigation devices, and gaming systems to function more efficiently. Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Seventh Embodiment

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 22:
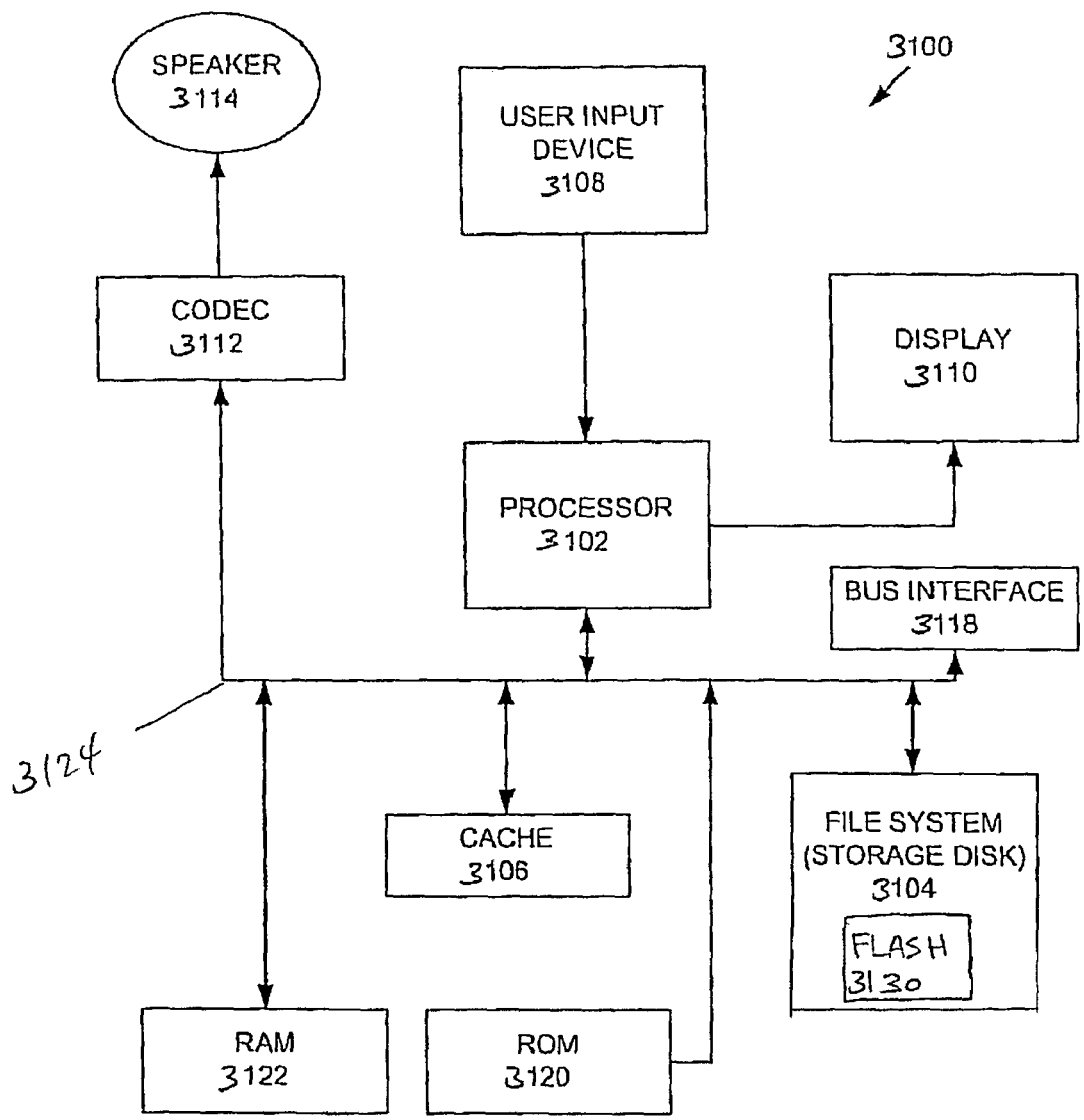
FIG. 22 illustrates an exemplary portable multimedia device, or media player, in accordance with an embodiment of the invention.

FIG. 22 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: bit lines formed in a semiconductor substrate; insulating film lines located on the bit lines to successively run in a length direction of the bit lines; gate electrodes located above the semiconductor substrate between the bit lines; word lines located on the gate electrodes to run in a width direction of the bit lines; and a trench region formed between the bit lines and the between word lines in the semiconductor substrate. As a result, the flash memory 3130 is able to isolate elements between word lines and allowing further miniaturization of memory cells. Consequently, embodiments allow a greater memory density for flash memory devices, which allows various devices, such as mobile phones, personal digital assistants, set-top boxes, digital video recorders, networking and telecommunication equipments, printers, computer peripherals, automotive navigation devices, and gaming systems to function more efficiently. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

The invention claimed is:

1. A semiconductor device comprising:
bit lines formed in a semiconductor substrate;
insulating film lines having side surfaces that are coincident with the side surfaces of the bit lines located on the bit lines to successively run in a length direction of the bit lines;
gate electrodes located above the semiconductor substrate between the bit lines;
word lines located on the gate electrodes to run in a width direction of the bit lines;
a trench region formed between the bit lines and the between the word lines in the semiconductor substrate; and
an insulating film layer provided on the trench region.

2. The semiconductor device as claimed in claim 1, wherein side surfaces of the insulating film lines are substantially perpendicular to a surface of the semiconductor substrate.

3. The semiconductor device as claimed in claim 1, wherein each of the insulating film lines includes silicon oxide film.

4. The semiconductor device as claimed in claim 1, further comprising a barrier layer provided between the trench region and the insulating film layer, wherein the insulating film layer includes a silicon nitride film, and the barrier layer includes a silicon oxide film.

5. The semiconductor device as claimed in claim 1, further comprising a channel-cut region formed in the semiconductor substrate in the trench region, the channel-cut region having an opposite type impurity to those of the bit lines.

6. The semiconductor device as claimed in claim 5, further comprising sidewalls formed on sides of the trench region.

7. The semiconductor devices as claimed in claim 1 wherein ONO films located between the semiconductor substrate and the gate electrodes.

8. A wireless communications device, said wireless communications device comprising:
a flash memory comprising:
bit lines formed in a semiconductor substrate;
insulating film lines having side surfaces that are coincident with the side surfaces of the bit lines located on the bit lines to successively run in a length direction of the bit lines;
gate electrodes located above the semiconductor substrate between the bit lines;
word lines located on the gate electrodes to run in a width direction of the bit lines;
a trench region formed between the bit lines and between the word lines in the semiconductor substrate; and
an insulating film layer provided on the trench region,
a processor;
a communications component;
a transmitter;
a receiver; and
an antenna connected to the transmitter circuit and the receiver circuit.

9. The wireless communications device of claim 8, wherein said flash memory is NAND flash memory.

10. The wireless communications device of claim 8, wherein said flash memory is NOR flash memory.

11. The wireless communications device of claim 8, wherein said flash memory utilizes mirrorbits technology.

12. A computing device comprising:
a processor;
an input component;
an output component;
a memory comprising:
a volatile memory; and a flash memory comprising:
bit lines formed in a semiconductor substrate;
insulating film lines having side surfaces that are coincident with the side surfaces of the bit lines located on the bit lines to successively run in a length direction of the bit lines;
gate electrodes located above the semiconductor substrate between the bit lines;
word lines located on the gate electrodes to run in a width direction of the bit lines;
a trench region formed between the bit lines and between the word lines in the semiconductor substrate; and
an insulating film layer provided on the trench region.

13. The computing device of claim 12, wherein said computing device is a personal computer (PC).

14. The computing device of claim 12, wherein said computing device is a personal digital assistant (PDA).

15. The computing device of claim 12, wherein said computing device is a gaming system.

16. A portable media player comprising:
a processor;
a cache;
a user input component;
a coder-decoder component; and
a memory comprising:
a flash memory comprising:
bit lines formed in a semiconductor substrate;
insulating film lines having side surfaces that are coincident with the side surfaces of the bit lines located on the bit lines to successively run in a length direction of the bit lines;
gate electrodes located above the semiconductor substrate between the bit lines;
word lines located on the gate electrodes to run in a width direction of the bit lines;
a trench region formed between the bit lines and between the word lines in the semiconductor substrate; and
an insulating film layer provided on the trench region.

17. The portable media player of claim 16, wherein said portable media player is a portable music player.

18. The portable media player of claim 16, wherein said portable media player is a portable video player.

* * * * *